US005497022A

United States Patent [19]
Sakamoto

[11] Patent Number: 5,497,022
[45] Date of Patent: Mar. 5, 1996

[54] SEMICONDUCTOR DEVICE AND A METHOD OF MANUFACTURING THEREOF

[75] Inventor: Osamu Sakamoto, Hyogo, Japan

[73] Assignee: Mitsubishi Denki Kabushiki Kaisha, Tokyo, Japan

[21] Appl. No.: 185,439

[22] Filed: Jan. 24, 1994

[30] Foreign Application Priority Data

Jan. 22, 1993 [JP] Japan .................................. 5-009372
Dec. 22, 1993 [JP] Japan .................................. 5-325041

[51] Int. Cl.$^6$ .................................................. H01L 29/78
[52] U.S. Cl. ..................... 257/377; 257/385; 257/752; 257/903; 257/755
[58] Field of Search ........................... 257/69, 377, 755, 257/903, 904, 393, 382, 385, 752, 384; 437/200; 365/154, 156

[56] References Cited

U.S. PATENT DOCUMENTS 5,151,387  9/1992  Brady et al. ............................. 437/191
5,336,916  8/1994  Chan et al. .............................. 257/377

FOREIGN PATENT DOCUMENTS 2-148852  6/1990  Japan ..................................... 257/377

OTHER PUBLICATIONS

"A Memory Cell with Polysilicon Thin Film Transistor (TFT) for a 4Mbit SRAM", by Kazuhito Tsutsumi et al, Institute of Electronics and Communication Engineers of Japan Technical Report, vol. 90, No. 48, pp. 7–13. 1991.

Primary Examiner—Donald L. Monin, Jr.
Attorney, Agent, or Firm—Lowe, Price, LeBlanc & Becker

[57] ABSTRACT

A semiconductor device includes a polycrystalline silicon layer formed on a silicon layer with an oxide film therebetween, an interlayer insulating layer formed to cover the surface of the silicon layer and the surface of the polycrystalline silicon layer, and a silicon plug layer formed in an embedded manner in a contact hole in the interlayer insulating layer to be directly connected to the surface of an end portion of the polycrystalline silicon layer and the surface of the silicon layer in the proximity of the end portion of the polycrystalline silicon layer. The polycrystalline silicon layer and the silicon plug layer have the same type of conductivity. By this interconnection structure, the semiconductor device is improved in the patterning accuracy of the contact portion of a multilayer stacked interconnection. Furthermore, an ohmic contact between conductive interconnection layers can be realized with relatively simple manufacturing steps without occurrence of a voltage drop caused by a pn junction.

16 Claims, 26 Drawing Sheets

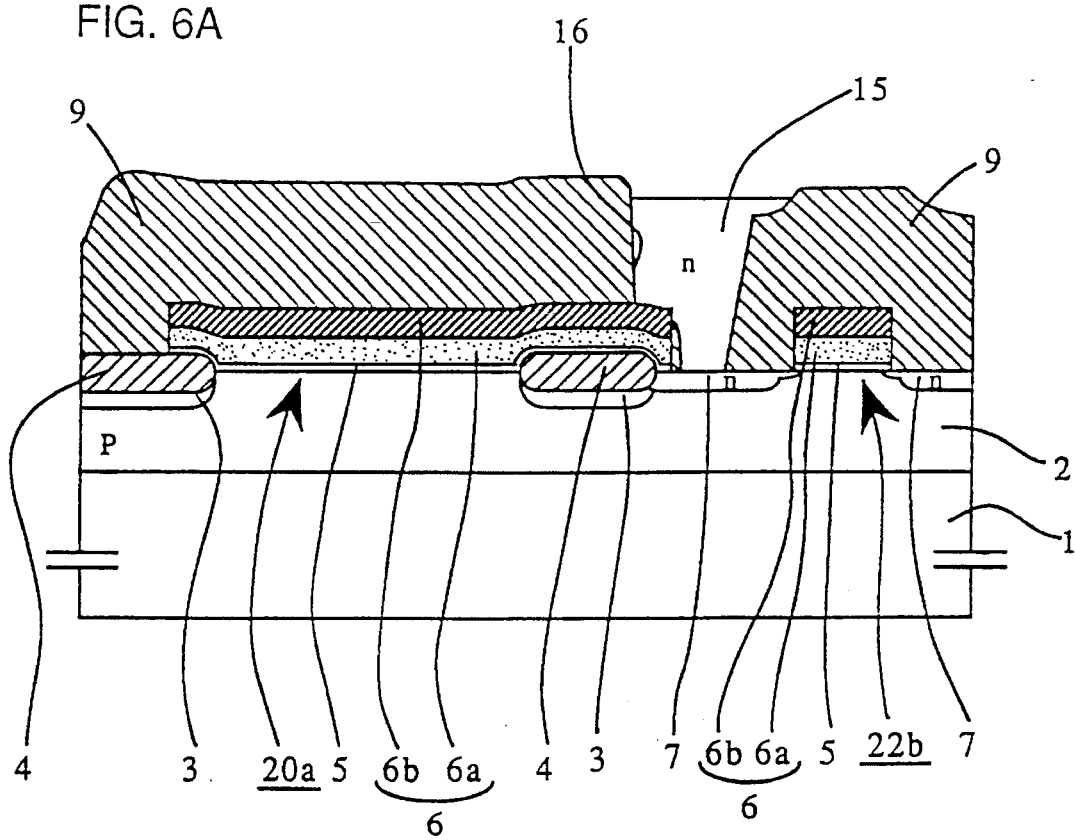
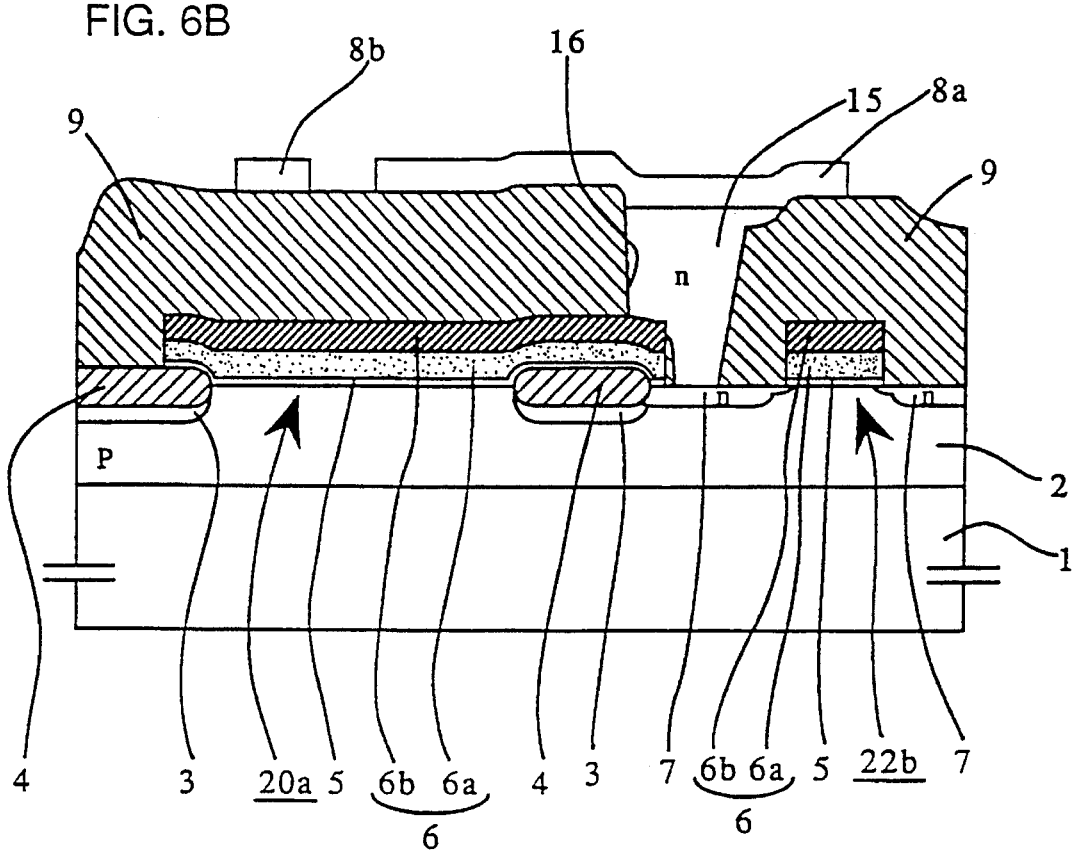

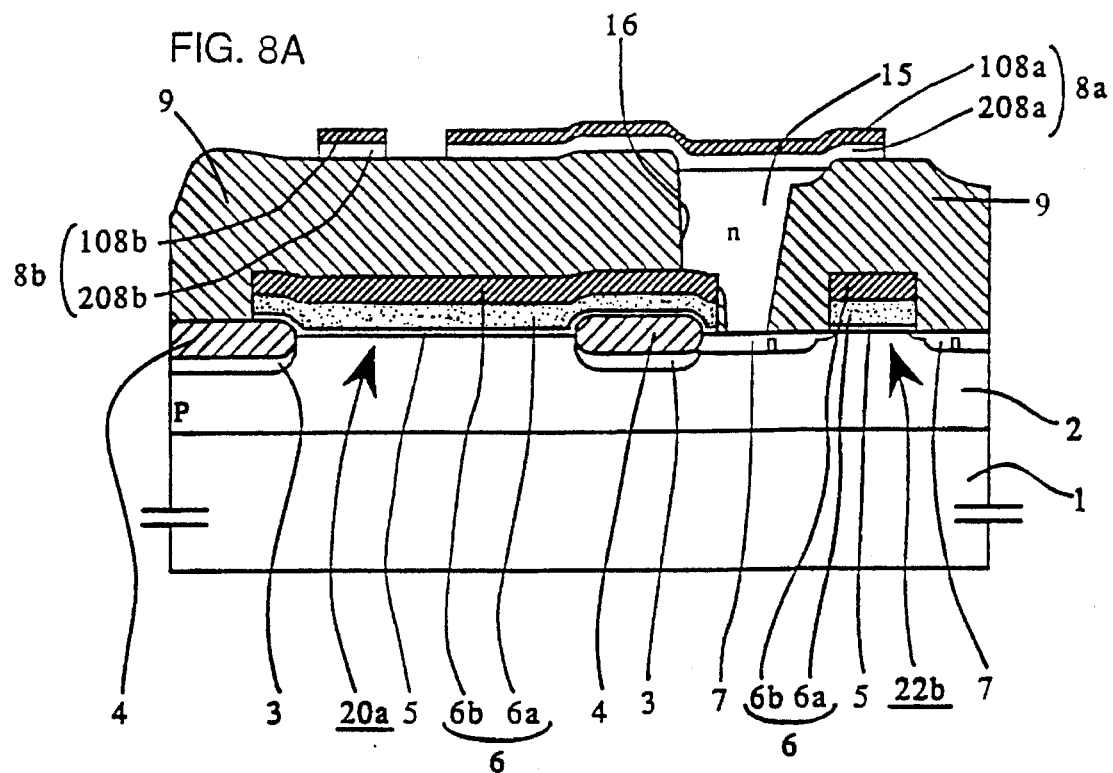
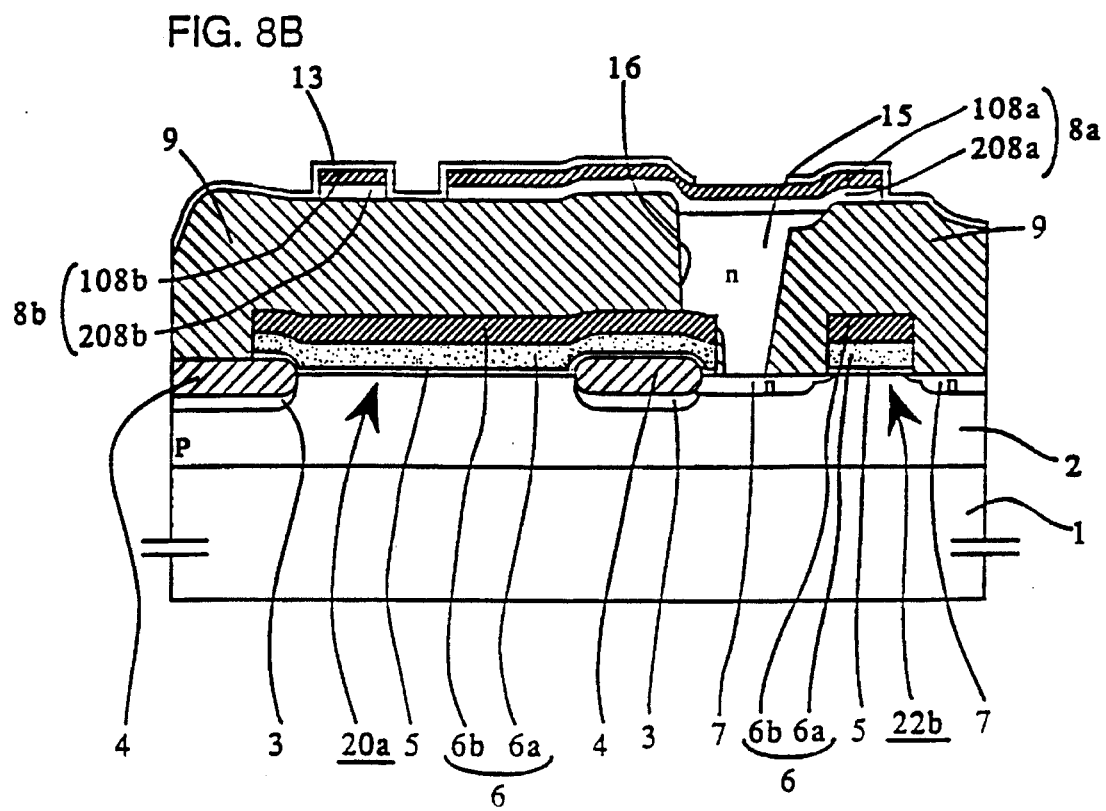

SEMICONDUCTOR DEVICE AND A METHOD OF MANUFACTURING THEREOF

BACKGROUND OF THE INVENTION

1. Field of the Invention

The present invention relates to a semiconductor device having a multilayer interconnection structure and a method of manufacturing thereof, and more particularly, to improvement of an interconnection contact structure in a step-graded region and a manufacturing method thereof.

2. Description of the Background Art

In the field of semiconductor devices, increase of integration density and miniaturization of an element structure are required. In order to meet such requirements, a structure is conceived in which a plurality of elements are stacked three-dimensionally on a surface of a semiconductor substrate. Although such a stacked type semiconductor device increases the integration density of a main surface of the semiconductor substrate, several problems arise from the fact that an interconnection layer is disposed on a region having an abrupt change in level.

A structure of an SRAM (Static Random Access Memory) will be described as an example of a semiconductor device having a structure in which semiconductor elements are stacked on a substrate. FIGS. 17 through 19 show a structure of a memory cell of a CMOS (Complementary Metal Oxide Semiconductor) type SRAM using a thin film transistor as a load, which is disclosed in "A Memory Cell with Polysilicon Thin Film Transistor (TFT) for a 4 Mbit SRAM", Tsutsumi et al., Institute of Electronics and Communication Engineers of Japan Technical Report, Vol. 90, No. 48, pp.7–13. FIG. 20 is an equivalent circuit diagram of a memory cell of this SRAM. Referring to FIG. 20, a memory cell of a CMOS type SRAM has a pair of CMOS inverters. One CMOS inverter includes an n channel MOS drive transistor 20a and a p channel MOS thin film load transistor 21a. The other CMOS inverter includes an n channel MOS drive transistor 20b and a p channel MOS thin film load transistor 21b. The gates of transistors 20a, 21a of said one CMOS inverter are cross-coupled to a storage node 25b common to transistors 20b, 21b of the other CMOS inverter. The gates of transistors 20b, 21b of the other CMOS inverter are cross-coupled to a storage node 25a common to transistors 20a, 21a of the one CMOS inverter to form a flip-flop circuit. The sources of p channel MOS thin film load transistors 21a, 21b are connected to a power supply 23. Each of the sources of n channel MOS drive transistors 20a, 20b is connected to ground. Storage nodes 25a, 25b of the flipflop circuit are connected to n channel MOS transfer transistors 22a, 22b, respectively. The gates of n channel MOS transfer transistors 22a, 22b are connected to a word line 27. The drain regions of n channel MOS transfer transistors 22a, 22b are connected to bit lines 26a, 26b, respectively.

An operation of writing information into a memory cell will be described. For example, if storage node 25a and storage node 25b are set at a ground potential and a power supply potential, respectively, then bit line 26a and bit line 26b are set at ground level and power supply level, respectively. n channel MOS transfer transistors 22a, 22b are turned on by applying a predetermined potential to word line 27.

An operation of reading information from a memory cell will be described. Bit lines 26a, 26b are connected to a sense amplifier circuit. Under this state, word line 27 is supplied with a predetermined potential to turn on n channel MOS transfer transistors 22a, 22b. As a result, the potentials of storage nodes 25a, 25b are read out to bit lines 26a, 26b.

A specific structure of a memory cell of an SRAM will be described hereinafter with reference to FIGS. 17 through 19. For the sake of simplifying the description, the memory cell is divided into a lower layer portion (FIG. 17) and an upper layer portion (FIG. 18) with respect to a substrate. FIG. 19 is a sectional structural view taken along line X—X in FIGS. 17 and 18.

Referring to FIGS. 17 through 19, a memory cell of an SRAM includes n channel MOS drive transistors 20a, 20b and n channel MOS transfer transistors 22a, 22b in a lower layer region near the surface of a silicon substrate 1. In an upper layer region formed on the main surface of silicon substrate 1 with an interlayer insulating layer 9 thereunder, p channel MOS thin film load transistors 21a, 21b are arranged.

Referring mainly to FIG. 19, a p well region 2 is formed at the surface of silicon substrate 1. A field oxide film 4 and a $p^+$ isolation region 3 are formed in an element isolation region on the main surface of p well region 2. An n channel MOS drive transistor 20a and an n channel MOS transfer transistor 22b each include $n^+$ source/drain regions 7, a gate film 5 and a gate electrode 6. Gate electrode 6 has a polycide structure including a polycrystalline silicon layer 6a and a metal silicide film 6b formed on polycrystalline silicon layer 6a.

The surface of silicon substrate 1 is covered with a thick interlayer insulating layer 9. The p channel thin film load transistor 21b is formed on the surface of interlayer insulating layer 9. A thin film transistor 14 (identical to p channel thin film load transistor 21b) includes a gate electrode 8b formed on the surface of interlayer insulating layer 9, a gate oxide film 13 covering the surface of gate electrode 8b, $p^+$ source/drain regions 12a, 12c, and a channel region 12b. $p^+$ source/drain regions 12a, 12c and channel region 12b are formed in a thin polycrystalline silicon layer having a thickness of about 20 nm. Gate electrode 8b includes p type impurities.

An interconnection structure of storage node 25b will be described hereinafter to which the gate electrode of n channel MOS drive transistor 20a formed in the lower layer, the $n^+$ source/drain regions of n channel MOS transfer transistor 22b and the $p^+$ source/drain regions of p channel MOS thin film load transistor 21b formed in the upper layer are connected. An opening 16 is formed in interlayer insulating layer 9. Inside opening 16, gate electrode 6 of n channel MOS drive transistor 20a and one of $n^+$ source/drain regions 7 of n channel MOS transfer transistor 22b are exposed. An interconnection layer 8a of polycrystalline silicon is formed inside opening 16 to be connected to both gate electrode 6 of n channel MOS drive transistor 20a and $n^+$ source/drain region 7 of n channel MOS transfer transistor 22b. Such a contact structure is referred to as a "shared contact". A portion of interconnection layer 8a extends onto the surface of interlayer insulating layer 9. This is the gate electrode of p channel MOS thin film load transistor 21a. A polycrystalline silicon layer constituting a $p^+$ source/drain region 12a of p channel MOS thin film load transistor 21b is connected to the surface of the interconnection layer 8a. Interconnection layer 8a is formed of polycrystalline silicon, and includes p type impurities to provide conductivity. At the bottom of opening 16, a titanium silicide layer 11 is formed between interconnection layer 8a and source/drain region 7. Titanium silicide layer 11 prevents the formation of a pn junction caused by direct contact between interconnection layer 8a of p type and source/drain region 7 of n type. Such a structure is referred to as a "direct contact" in which interconnection layer 8a disposed on the surface of interlayer insulating layer 9 is connected to a lower layer, for example, an impurity region formed on the silicon substrate, through opening 16.

However, there is a problem that an interconnection layer cannot be easily patterned when a direct contact structure having great differences in level is formed such as the interconnection layer 8a in the above-mentioned memory cell of an SRAM. FIG. 21 is a sectional view showing a manufacturing step of forming interconnection layer 8a shown in FIG. 18. Following the formation of opening 16 in interlayer insulating layer 9, polycrystalline silicon layer 8 is deposited all over the surface by, for example, a CVD (Chemical Vapor Deposition) method. Then, a resist is applied onto the surface of polycrystalline silicon layer 8. The resist is exposed to a prescribed pattern by photolithography, and then developed to form a resist mask. Next, polycrystalline silicon layer 8 is etched using the resist mask to form interconnection layer 8a and gate electrode 8b of thin film transistor 14 (p channel thin film load transistor 21b).

It can be seen from FIG. 21 that polycrystalline silicon layer 8 is formed on the surface of interlayer insulating layer 9 having an abrupt change in level. The step-graded portion of the polycrystalline silicon layer is significant in the vicinity of opening 16. It is extremely difficult to form a very small resist mask on the surface of polycrystalline silicon layer 8 having such an abrupt change in level through the current exposure technology.

Recently, the step-graded portion is so abrupt that the range of the depth of a focus of an exposure device is often exceeded in a semiconductor integrated circuit. Therefore, resolution of a resist pattern was decreased, giving rise to a problem that a desired design resist pattern configuration could not be obtained in interconnection layer 8a of polycrystalline silicon. Degradation in the interconnection pattern accuracy will prevent reduction in size of the interconnection to reduce reliability thereof.

SUMMARY OF THE INVENTION

An object of the present invention is to provide a semiconductor device aiming at improving patterning accuracy of a contact portion of a multilayer stacked interconnection, and a method of manufacturing thereof.

Another object of the present invention is to provide, with a relatively simple step, a semiconductor device of a structure that can realize an ohmic contact between stacked conductive interconnection layers without a voltage drop caused by a PN junction, and a method of manufacturing thereof.

According to an aspect of the present invention, a semiconductor device includes a polycrystalline silicon layer formed on a semiconductor layer with an oxide film therebetween, and an interlayer insulating layer formed to cover the surfaces of the semiconductor layer and the polycrystalline silicon layer. A contact hole is formed in the interlayer insulating layer to expose the end surface of the polycrystalline layer and the surface of the semiconductor layer in the proximity of the end portion of the polycrystalline silicon layer. This contact hole is filled with a silicon layer so as to directly come into contact with the end surface of the polycrystalline silicon layer and the semiconductor layer surface in the proximity of the end portion of the polycrystalline silicon layer. The polycrystalline silicon layer and the silicon layer are of the same conductivity type.

According to the above interconnection structure, a silicon layer is formed in the internal of a contact hole to allow planarization of the silicon layer at the upper portion of the contact hole. Therefore, the interconnection layer disposed on the surface of the interlayer insulating layer will be formed on a flat surface of the silicon layer even at the region of the contact hole. This provides superior patterning accuracy of the interconnection layer.

Also, because the polycrystalline silicon layer and the silicon layer brought into contact within the contact hole have the same type of conductivity, a pn junction will not be established at the interface thereof. Even if the polycrystalline silicon layer and the silicon layer are brought into direct contact without providing an intermediate conductive layer such as of refractory metal at the interface thereof, a voltage drop will not occur. This means that the step of forming an intermediate conductive layer can be omitted.

According to another aspect of the present invention, a semiconductor device includes an interlayer insulating layer on the surface of a semiconductor layer, wherein a contact hole is formed in the interlayer insulating layer to expose the contact portion of the surface of the semiconductor layer. A silicon plug layer having a plane surface is buried in the contact hole. On the interlayer insulating layer, a first polycrystalline silicon layer is formed electrically in contact with the silicon plug layer in the contact hole. On the surface of the first polycrystalline silicon layer, a second polycrystalline silicon layer is formed with an oxide film thereunder to be electrically connected to the first polycrystalline silicon layer by forming a hole in the oxide film in the proximity of the region right above the contact hole. The first polycrystalline silicon layer and the second polycrystalline silicon layer have different conductivity types with an intermediate conductive layer provided at the junction boundary therebetween to reduce voltage drop caused by a pn junction, whereby a favorable junction is realized.

A method of manufacturing a semiconductor device of the present invention according to the said one aspect of the present invention includes the steps of: forming a polycrystalline silicon layer doped with impurities of one conductivity type on the surface of a semiconductor device with an oxide film therebetween; patterning the polycrystalline silicon layer to a predetermined configuration, and forming an interlayer insulating layer covering the surface of the patterned polycrystalline silicon layer and the surface of the semiconductor layer; forming a contact hole in the interlayer insulating layer so as to expose the surface of the end portion of the patterned polycrystalline silicon layer and the surface of the semiconductor layer in the proximity of the end portion of the polycrystalline silicon layer; and filling the contact hole with a silicon layer doped with impurities of a conductivity type identical to that of the polycrystalline silicon layer to provide direct contact between the surface of the end portion of the polycrystalline silicon layer and the surface of the semiconductor layer in the proximity of the end of the polycrystalline silicon layer.

A method of manufacturing a semiconductor device according to the said another aspect of the present invention includes the steps of: forming an interlayer insulating layer on the surface of the semiconductor layer; forming a contact hole in the interlayer insulating layer to expose a contact portion of the surface of the semiconductor layer; forming a silicon plug layer having a plane surface in the interior of the contact hole; forming a first polycrystalline silicon layer doped with impurities of a first conductivity type so as to directly come into contact with the surface of the interlayer insulating layer and the plane surface of the silicon plug layer; forming an oxide film on the surface of the first polycrystalline silicon layer; forming a hole in the oxide film only at a region above the contact hole to expose a corresponding region of the first polycrystalline silicon layer; forming a second polycrystalline silicon layer doped with impurities of a second conductivity type so as to directly come into contact with the surface of the oxide film and the surface of the exposed first polycrystalline silicon layer; and forming an intermediate conductive layer at the junction boundary where at least the first polycrystalline silicon layer and the second polycrystalline silicon layer are connected to decrease a voltage drop at the pn junction.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 6A–6D are sectional views showing the sequential manufacturing steps of the memory cell of the structure shown in FIG. 5.

FIGS. 8A–8B are sectional views sequentially showing the manufacturing steps of the memory cell of the structure shown in FIG. 7.

DESCRIPTION OF THE PREFERRED EMBODIMENTS

Embodiments of the present invention will be described in details hereinafter with reference to the drawings.

Figure 1:
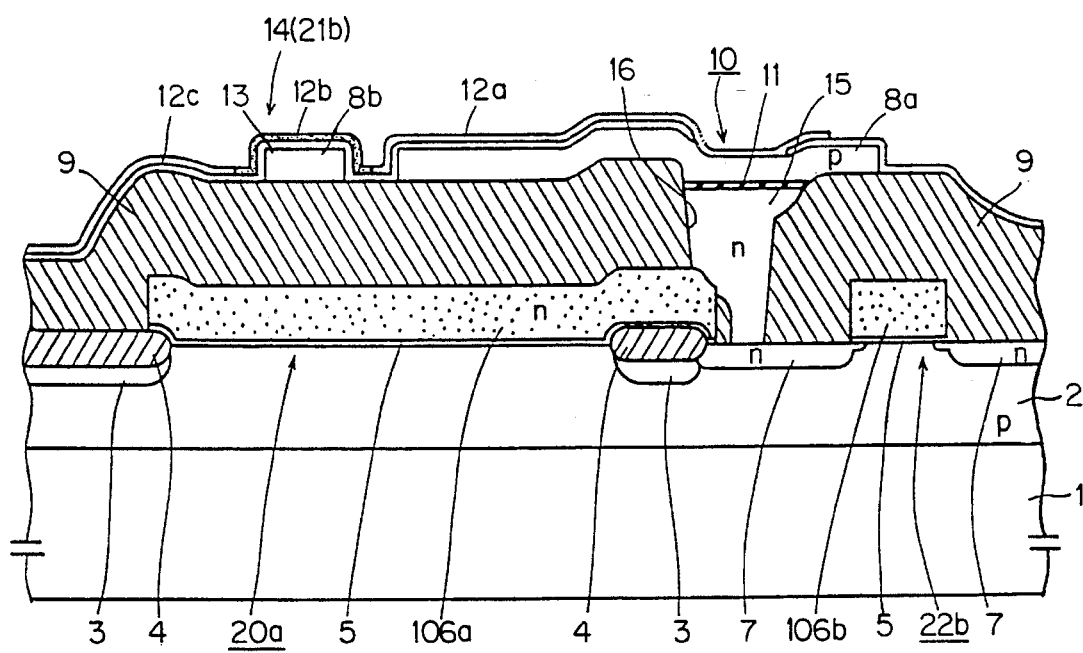
FIG. 1 is a sectional view of a structure of a SRAM memory cell according to a first embodiment of the present invention.
Figure 18:
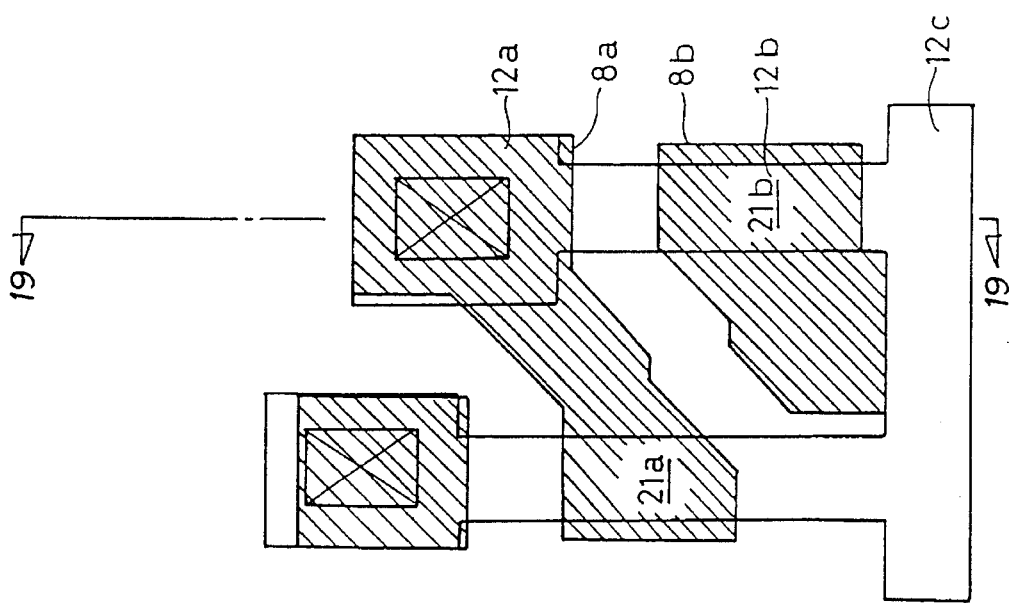
FIG. 18 is a diagram showing the plane structure of the upper portion of a conventional SRAM memory cell.
Figure 17:
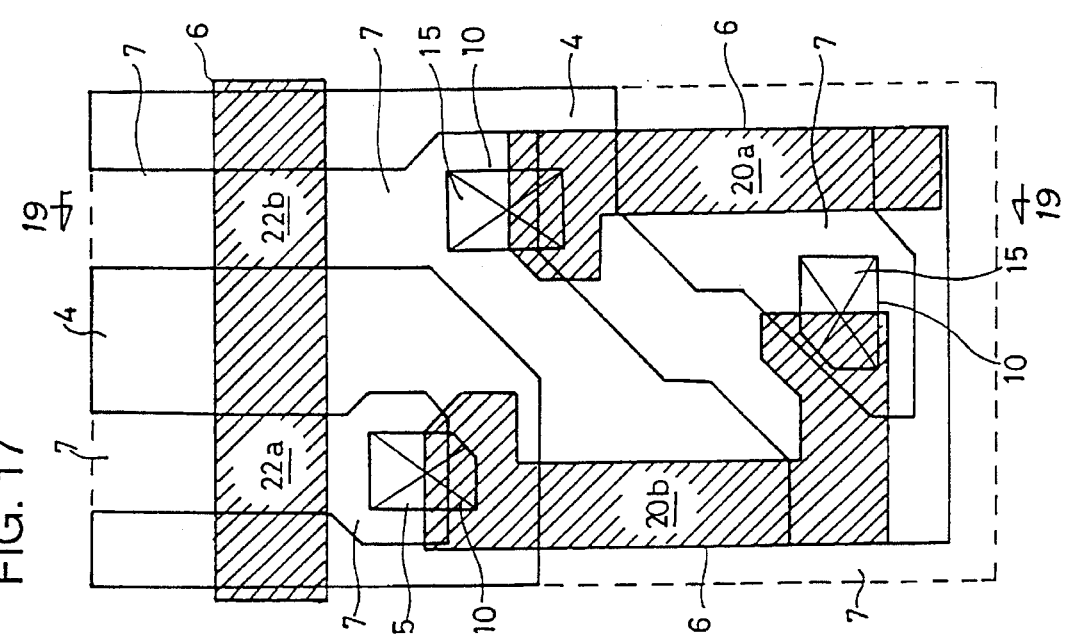
FIG. 17 is a diagram showing a plane structure of the lower portion of a conventional SRAM memory cell.
Figure 19:
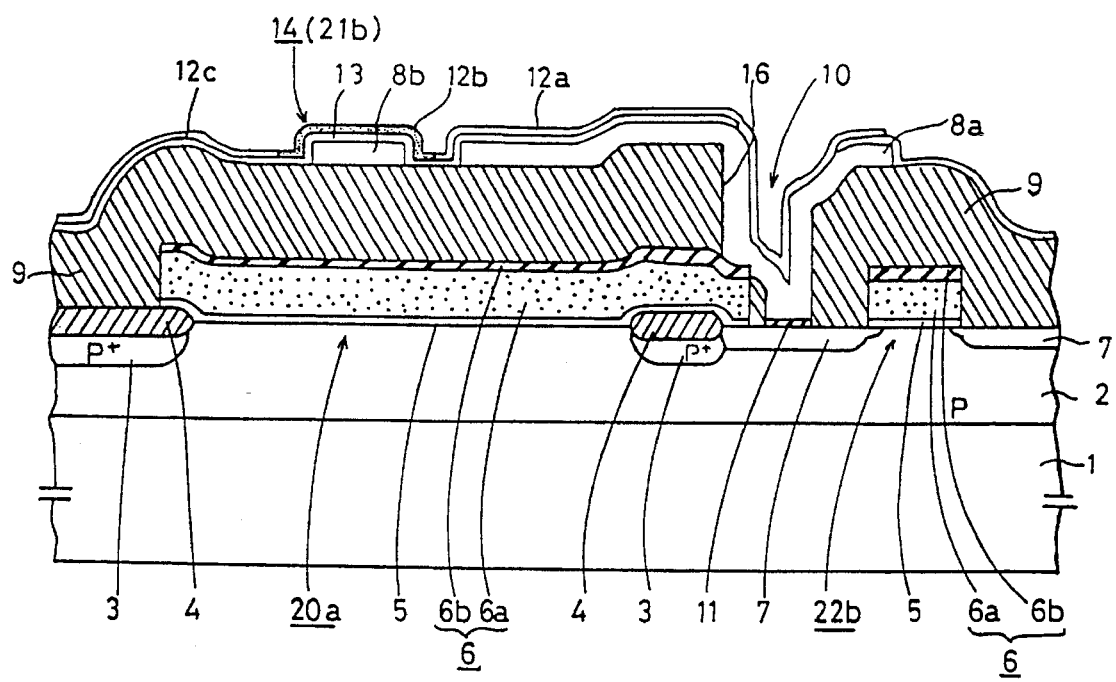
FIG. 19 is a sectional view taken along line X—X of FIGS. 17 and 18.
Figure 20:
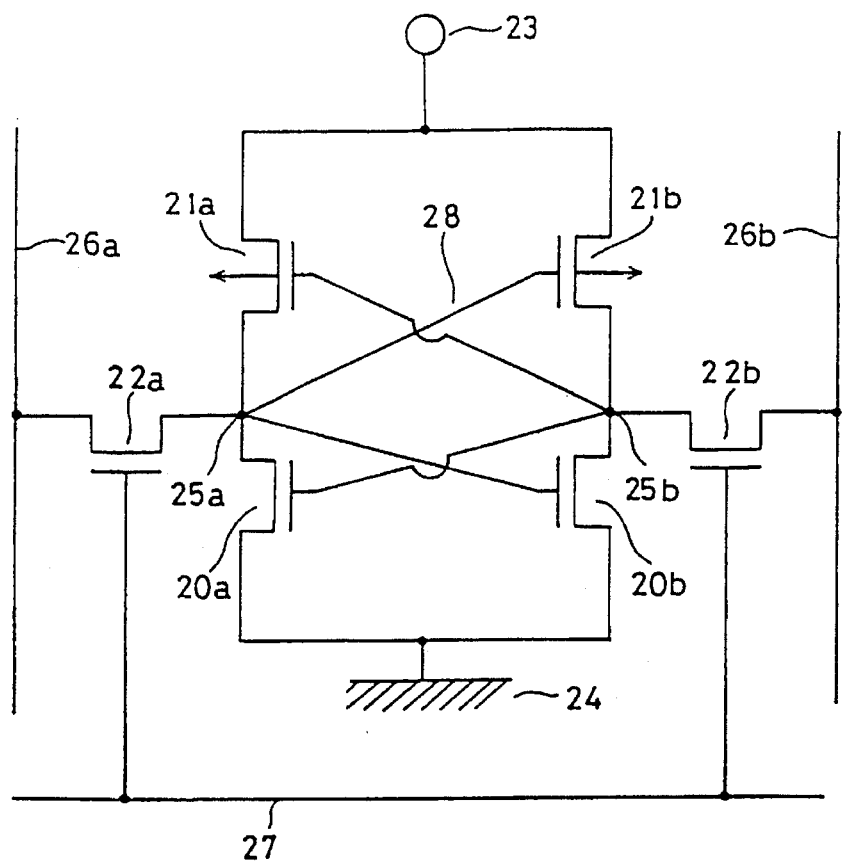
FIG. 20 is an equivalent circuit diagram of a SRAM memory cell.
Figure 21:
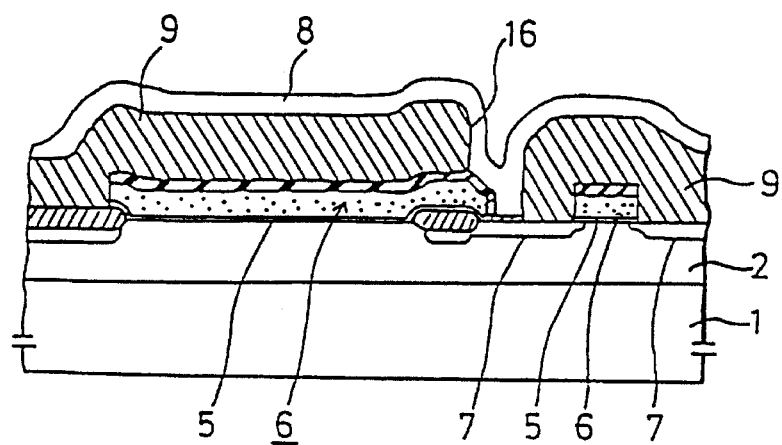
FIG. 21 is a sectional view showing a manufacturing step of the memory cell of FIG. 19.

FIG. 1 is a sectional view of a SRAM memory according to a first embodiment of the present invention. The plane structure of the memory cell of the present embodiment is similar to that of the conventional SRAM memory cell shown in FIGS. 17 and 18. The sectional structure of FIG. 1 is identical in location of that shown in FIG. 19 of the conventional SRAM. The sectional structure of the memory cell of FIG. 1 differs from that of FIG. 19 only in the structure of the direct contact. Therefore, only the direct contact structure of the present invention will mainly be described hereinafter. The structure of other portions should be referred to the description in the foregoing background section.

Referring to FIG. 1, a direct contact portion 10 includes a silicon plug layer 15 of n type polycrystalline silicon, a titanium silicide layer 11, and an interconnection layer 8a of p type polycrystalline silicon. An opening 16 is formed in an interlayer insulating layer 9. At the bottom of opening 16, an $n^+$ source/drain region 7 of an n channel MOS transfer transistor 22b and a gate electrode 106a of an n channel MOS drive transistor 20a are exposed. Gate electrode 106a is formed of a polycrystalline silicon layer having n type impurities introduced, which is formed at the same time a gate electrode 106b of n channel MOS transfer transistor 22b is formed. Opening 16 is filled with a silicon plug layer 15 of polycrystalline silicon directly in contact with $n^+$ source/drain region 7 and gate electrode 106a. Gate electrode 106a and silicon plug layer 15 internally have n type impurities introduced such as phosphorus (P) or arsenic (As) for providing conductivity. Titanium silicide layer 11 is formed at the surface of silicon plug layer 15. Interconnection layer 8a of polycrystalline silicon is formed on the surface of titanium silicide layer 11. Interconnection layer 8a internally has p type impurities introduced.

The direct contact structure of interconnection layer 8a with source/drain region 7 and gate electrode 106a improve the planarization of interconnection layer 8a by forming silicon plug layer 15 in an embedded manner in opening 16. By interposing titanium silicide layer 11 between interconnection layer 8a and silicon plug layer 15, an ohmic contact can be obtained between interconnection layer 8a, and silicon plug layer 15, source/drain region 7 and gate electrode 106a. Titanium silicide layer 11 prevents the formation of a pn junction which was caused by direct contact between p type interconnection layer 8a and n type polycrystalline silicon plug layer 15. Titanium silicide layer 11 preferably has a thickness in the range of 13–200 nm. A titanium silicide layer having a thickness of less than 13 nm will result in processing problems such as a pin hole generated in the layer.

The junction portion of gate electrode 106a and silicon plug layer 15 inside contact hole 16 will not generate a voltage drop caused by a pn junction since they are both of an n conductivity type. It is not necessary to provide an intermediate conductive layer such as of refractory metal silicide at the junction interface thereof, and the polycrystalline silicon layers can be formed in direct contact with each other.

A method of manufacturing the SRAM memory cell shown in FIG. 1 will be described hereinafter. FIGS. 2A–2J are sectional views sequentially showing the manufacturing steps.

Figure 2A:
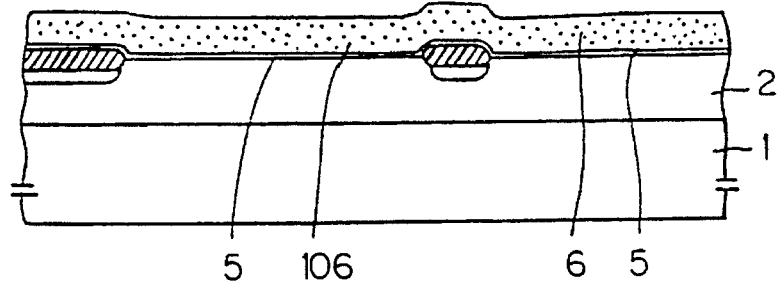
FIGS. 2A–2J are sectional views showing the sequential steps of manufacturing the memory cell of the structure of FIG. 1.

Referring to FIG. 2A, p type impurities are implanted by ion implantation or the like onto the main surface of a silicon substrate 1. A heat treatment is applied to diffuse the p type impurities to a depth of approximately 2–3 μm from the main surface of substrate 1, whereby a p well 2 is formed. Then, by LOCOS (LOCal Oxidation of Silicon), a field oxide film 4 and a p$^+$ isolation layer 3 are formed at predetermined regions on the surface of p type well for element isolation. Then, an oxide film 5 of 12 nm–15 nm in thickness is formed on the surface of p well 2 by thermal oxidation or the like. Oxide film 5 is the gate oxide film 5 of MOS transistors 20a and 22b. A polycrystalline silicon film 106 having n type impurities introduced such as phosphorus or arsenic is deposited on the surface of oxide film 5 to result in the sectional structure shown in FIG. 2A.

Figure 2B:
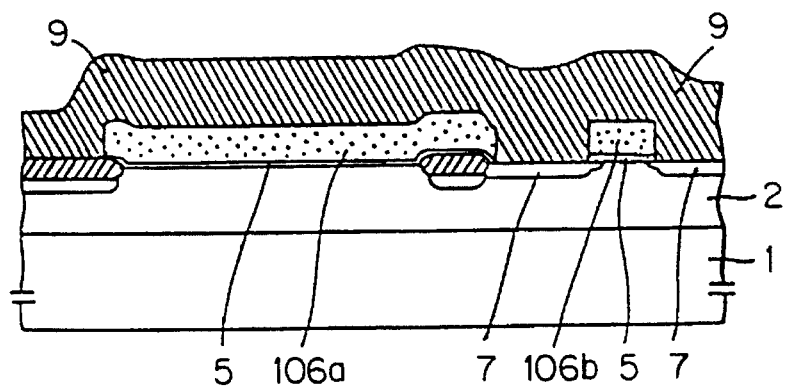
Figure 2C:
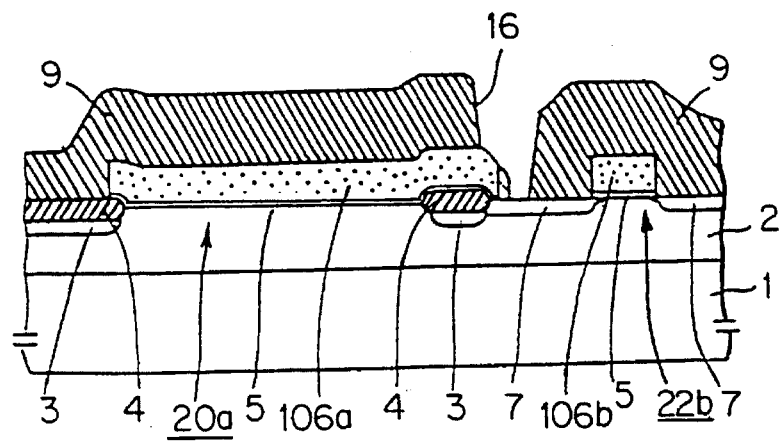

Referring to FIG. 2B, polycrystalline silicon film 106 is patterned to a predetermined configuration by photolithography and etching. As a result, gate electrodes 106a and 106b of MOS transistors 20a and 22b, respectively, are formed. Using the patterned gate electrodes 106a and 106 as a mask, n type impurity ions are implanted into p well 2 at a dosage of $4 \times 10^{15}/cm^2$ by ion implantation. Then, a heat treatment is applied to form N$^+$ source/drain regions 7 of the four MOS transistors 20a, 20b (not shown in FIG. 1), 22a (not shown in FIG. 1) and 22b. By the above steps, n channel MOS drive transistors 20a and 20b and n channel MOS transfer transistors 22a and 22b are formed. Then, a BPSG film (Boro Phospho Silicate Glass) is formed all over the surface of silicon substrate 1 by an atmospheric pressure CVD method. Next, a heat treatment is applied to make the BPSG reflow, whereby the surface of the BPSG film is planarized. Interlayer insulating layer 9 having a planarized surface is formed by this step, to result in the sectional structure shown in FIG. 2B. Then, an opening 16 is formed in interlayer insulating layer 9 for direct contact by photolithography and etching to result in the sectional structure of FIG. 2C. Reactive ion etching, for example, is used in the formation of opening 16.

Figure 2D:
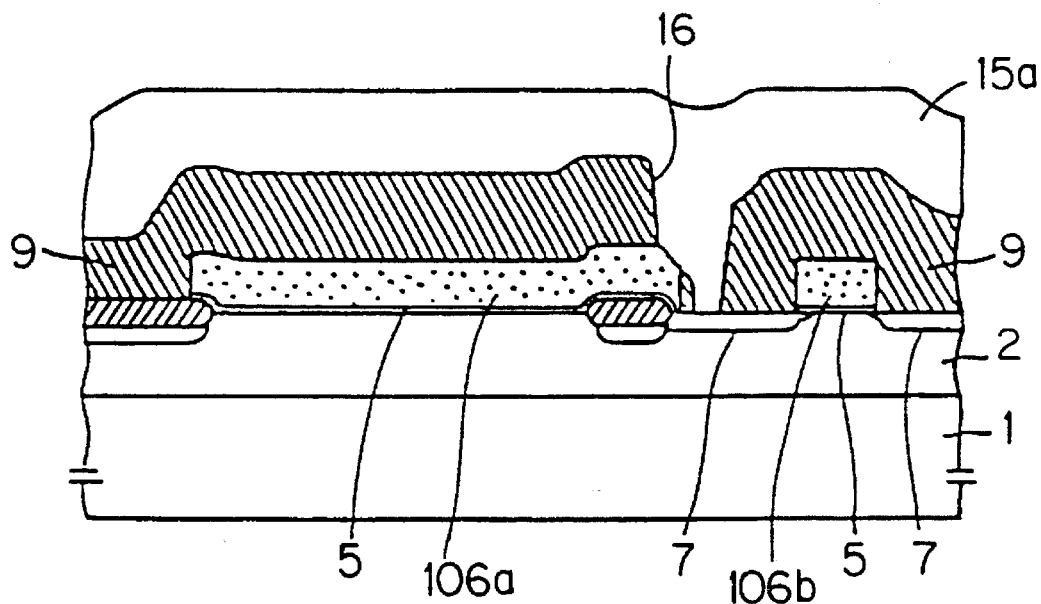

Referring to FIG. 2D, a polycrystalline silicon layer 15a not doped with impurities is formed on the surface of interlayer insulating layer 9 by LPCVD (Low Pressure Chemical Vapor Deposition). Polycrystalline silicon layer 15a is deposited to a thickness that completely fills the interior of opening 16 and that establishes planarization at the upper portion of opening 16. A standard film thickness of polycrystalline silicon layer 15a is at least half of the maximum diameter of opening 16.

Figure 2E:
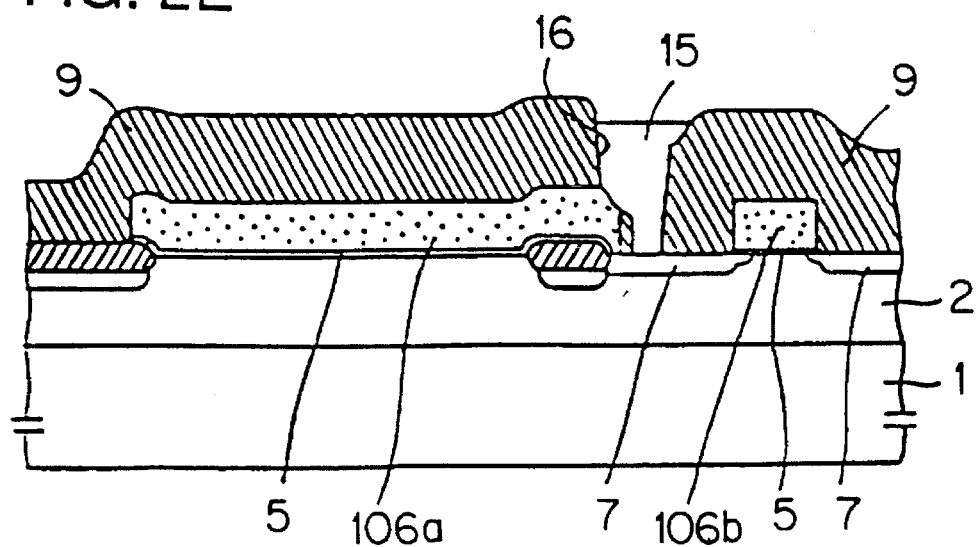

Referring to FIG. 2E, polycrystalline silicon layer 15a is etched by an etchback method to remain only inside opening 16. This etching is carried out isotropically. Isotropic etching allows polycrystalline silicon layer 15a on the surface of interlayer insulating layer 9 to be removed isotropically. As a result, polycrystalline silicon layer 15a remains only inside opening 16 to form polycrystalline silicon plug layer 15.

Figure 2F:
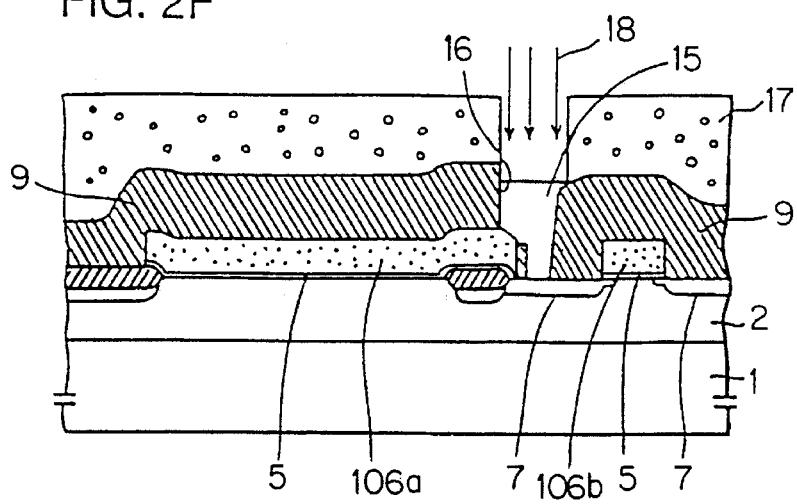

Referring to FIG. 2F, a resist pattern 17 having an opening only above opening 16 is formed on the surface of interlayer insulating layer 9. Using resist pattern 17 as a mask, n type impurities 18 are introduced into silicon plug layer 15 by ion implantation to provide conductivity. In this embodiment, n type impurities such as phosphorus or arsenic are ion-implanted at a dosage of $1.5 \times 10^{16}/cm^2$ and at an implantation energy of 150 keV. Then, resist pattern 17 is removed and a thermal treatment is applied, whereby the impurities are activated.

Figure 2G:
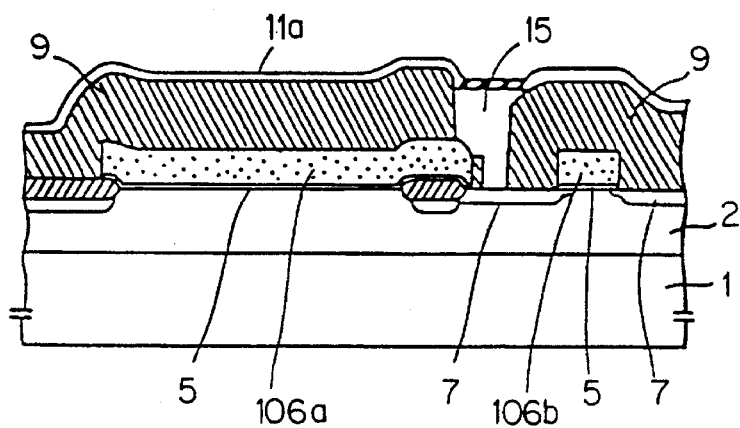

Referring to FIG. 2G, a titanium layer 11a is deposited by sputtering all over the surface of interlayer insulating layer 9 and the surface of polycrystalline silicon plug layer 15. Then, the titanium layer located above the surface of silicon plug layer 15 is silicidized by RTA (Rapid Thermal Annealing).

Figure 2H:
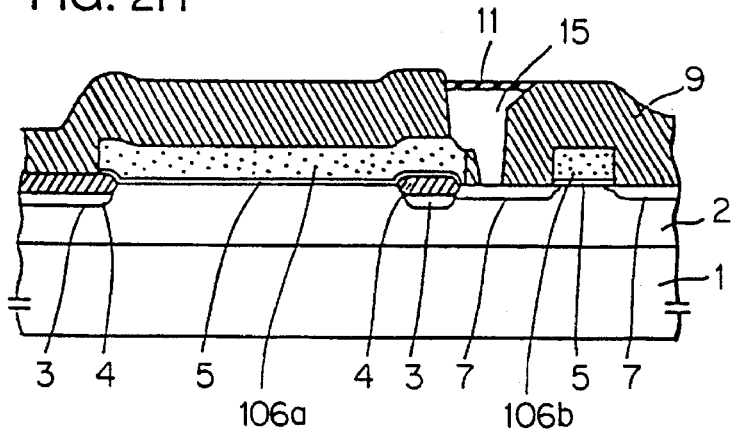
Figure 2I:
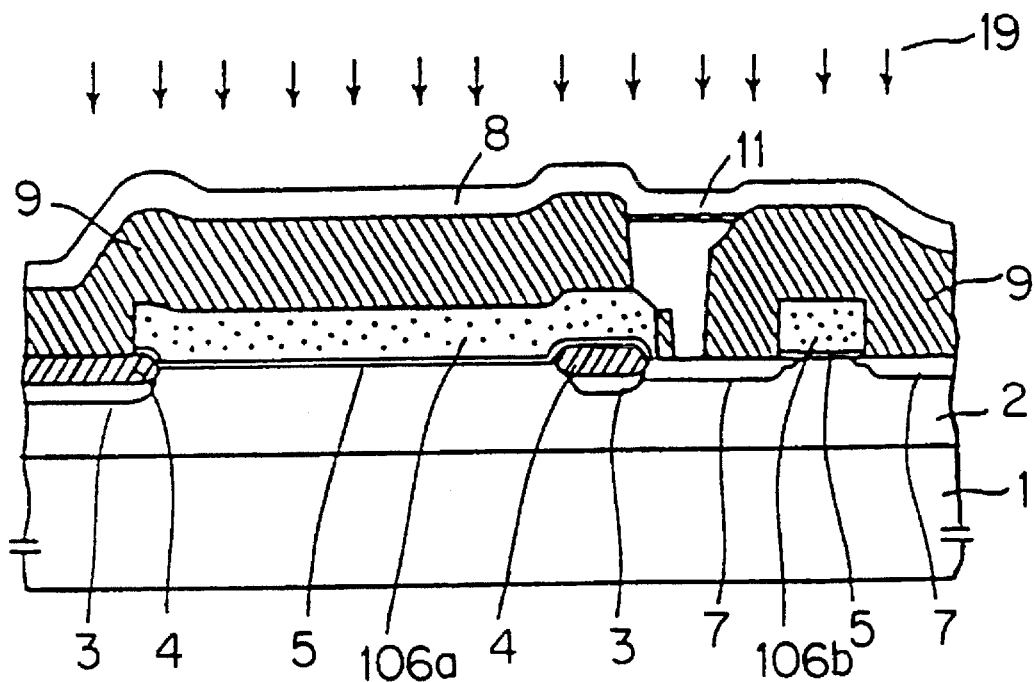

Referring to FIG. 2H, unreacted titanium layer 11a on the surface of interlayer insulating layer 9 is removed. As a result, a titanium silicide layer 11 is formed on the surface of silicon plug layer 15. Referring to FIG. 2I, polycrystalline silicon layer 8 not having impurities introduced is deposited to a thickness of appropriately 100 nm on the surface of interlayer insulating layer 9 and titanium silicide layer 11 by LPCVD. Then, p type impurity ions 19 are implanted at a dosage of approximately $8 \times 10^{15}/cm^2$ into polycrystalline silicon layer 8. Then, a heat treatment is applied to activate the p type impurity ions.

Figure 2J:
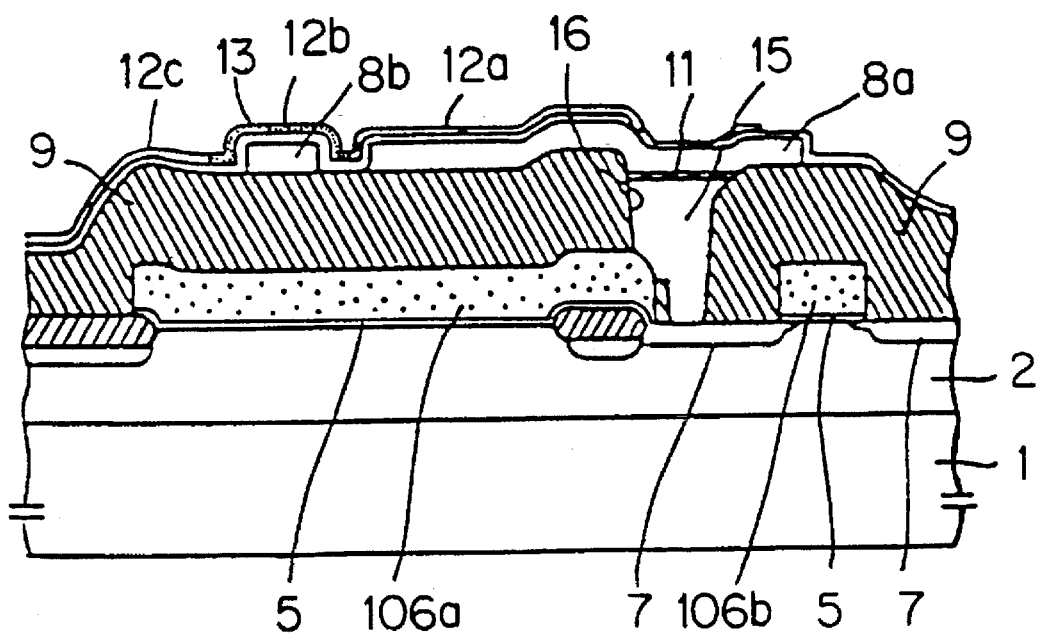

Referring to FIG. 2J, p type polycrystalline silicon layer 8 is patterned by photolithography and etching. As a result, gate electrode 8b of p channel MOS transistors 21a (not shown in FIG. 1) and 21b, and interconnection layer 8a are formed. A gate oxide film 13 of approximately 20 nm in thickness is deposited all over the surfaces of interlayer insulating layer 9, gate electrode 8b, and interconnection layer 8a by, for example, LPCVD. Then, an opening is formed in a portion of gate oxide film 13 located above opening 16. A polycrystalline silicon layer of approximately 10 nm in thickness is formed all over the surface of gate oxide film 13 and the surface of the opening portion of gate oxide film 13 by, for example, LPCVD. Then, a resist pattern is formed on this polycrystalline silicon layer corresponding to the channel region of p type channel load MOS transistors and p$^+$ source/drain regions. Using this resist pattern as a mask, the polycrystalline silicon layer is patterned by etching. Next, a resist is formed on a region of the polycrystalline silicon layer corresponding to the channel regions of p channel MOS thin film load transistors 21a and 21b. Using this resist as a mask, p type impurity ions are implanted at a dosage of approximately $1 \times 10^{15}/cm^2$ into this polycrystalline silicon layer. As a result, p$^+$ source/drain regions 12a and 12c of p channel MOS thin film load transistor 21b are formed.

By the above-described steps, the structure of a SRAM memory cell shown in FIG. 1 is completed.

A structure of a SRAM memory cell according to a second embodiment of the present invention will be described hereinafter with reference to FIG. 3.

Figure 3:
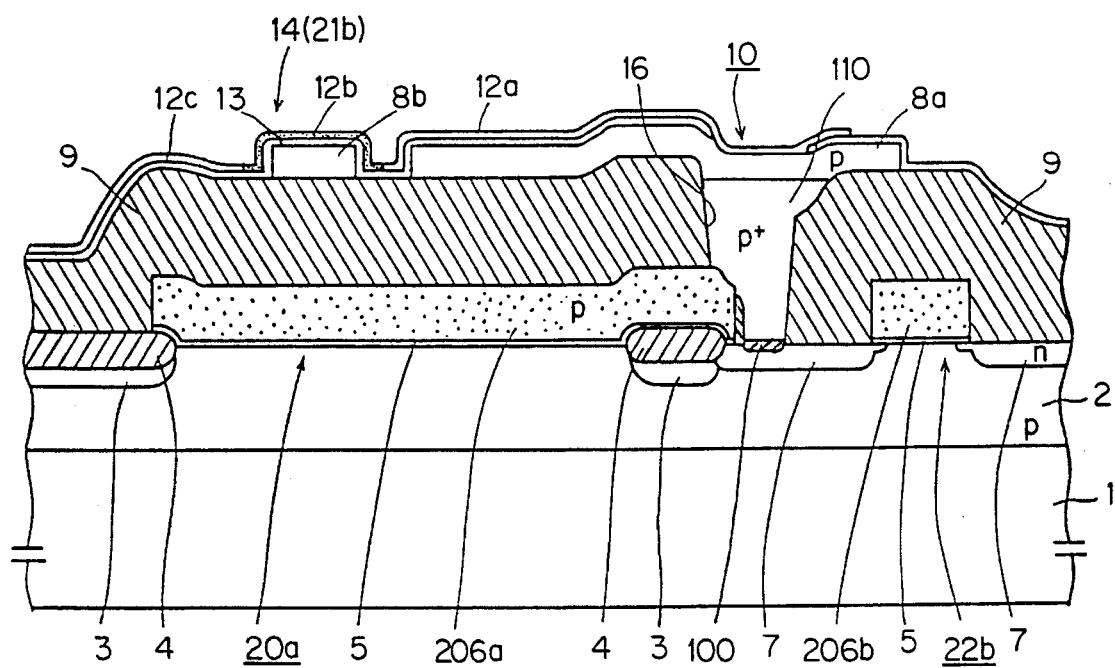
FIG. 3 is a sectional view of a structure of a SRAM memory cell according to a second embodiment of the present invention.

Referring to FIG. 3, the memory cell of the present embodiment includes gate electrodes 206a and 206b, a silicon plug layer 110 and an interconnection layer 8a, all of the same p conductivity type. In other words, each of the layers is formed of a polycrystalline silicon layer having p type impurities such as boron introduced.

According to the present embodiment of this structure, a titanium silicide layer 11 serving as an intermediate conductive layer in the above-described first embodiment is not required because gate electrode 206a and silicon plug layer 110 do not form a pn junction and because interconnection layer 8a has a p type conductivity identical to that of silicon plug layer 110. This means that silicon plug layer 110 and interconnection layer 8a are directly in contact with each other to form an ohmic contact. The manufacturing steps of forming refractory metal and applying a heat treatment for silicidization are omitted because it is not necessary to provide an intermediate conductive layer of refractory metal silicide layer on the planarized surface of the silicon plug layer.

A method of manufacturing the memory cell of FIG. 3 will be described with reference to FIGS. 4A–4F. The step of FIG. 4A corresponds to the step of FIG. 2C of the first embodiment. Instead of the steps shown in FIGS. 2B and 2C of the first embodiment in which an n type polycrystalline silicon film 106 is formed and patterned to result in n type gate electrodes 106a and 106b, the manufacturing method of the present embodiment includes the steps of forming a p type polycrystalline silicon film having boron or the like doped and patterning the same to obtain p type gate electrodes 206a and 206b.

Figure 4A:
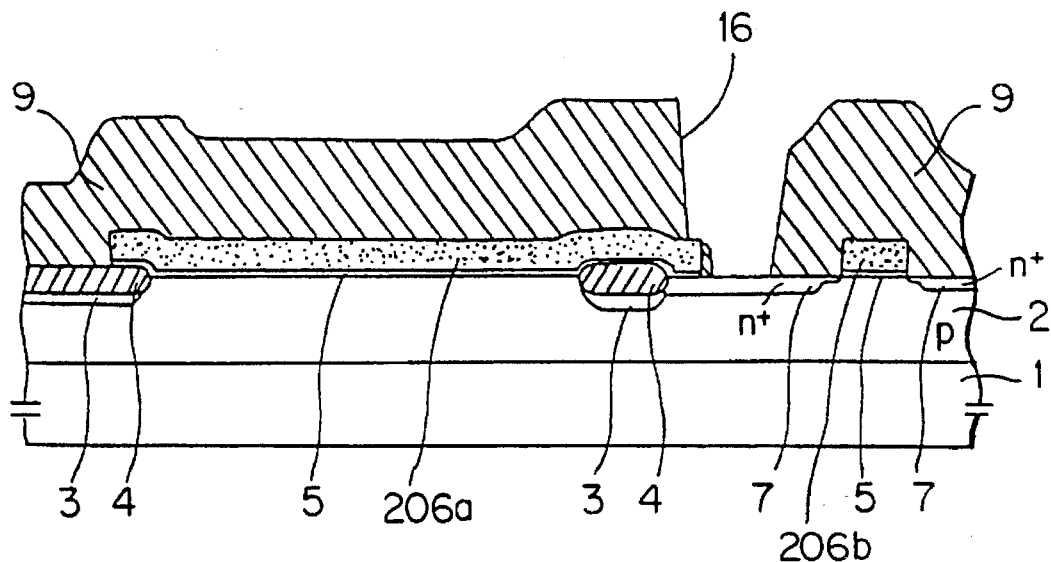
FIGS. 4A–4F are sectional views showing the sequential steps of manufacturing the memory cell of the structure of FIG. 3.
Figure 4B:
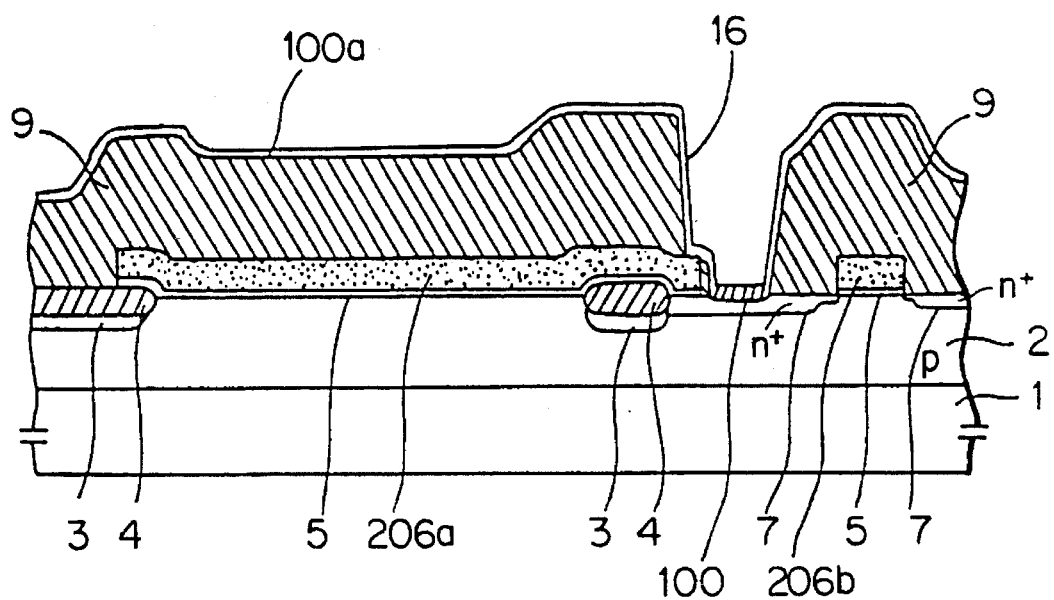

Referring to FIG. 4B subsequent to the step of FIG. 4A, a titanium layer 100a of approximately 50 nm in thickness is formed on interlayer insulating layer 9 and at the sidewall of opening 16, and all over the surface of source/drain region 7 exposed at the bottom of opening 16 by a sputtering method. Then, only the portion of the titanium layer in contact with the surface of n⁺ source/drain region 7 is silicidized by RTA to result in a titanium silicide layer 100.

Figure 4C:
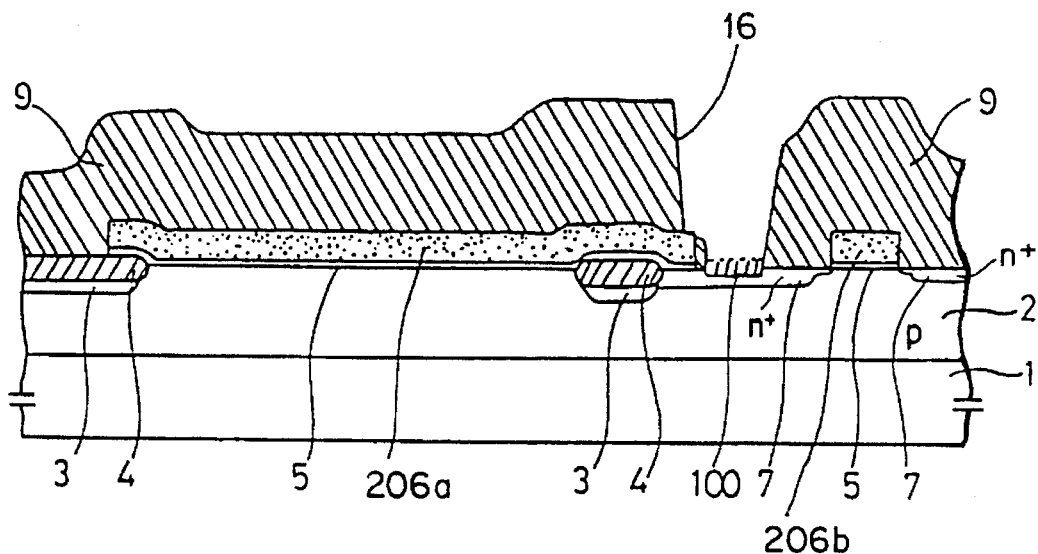

Referring to FIG. 4C, unreacted titanium layer 100a formed on the surface of interlayer insulating layer 9 and on the sidewall of opening 16 is removed with a mixed agent of sulfuric acid and hydrogen peroxide. As a result, a titanium silicide layer 100 is formed only the surface of n⁺ source/drain region 7. Titanium silicide layer 100 has a film thickness of approximately 70 nm.

Figure 4D:
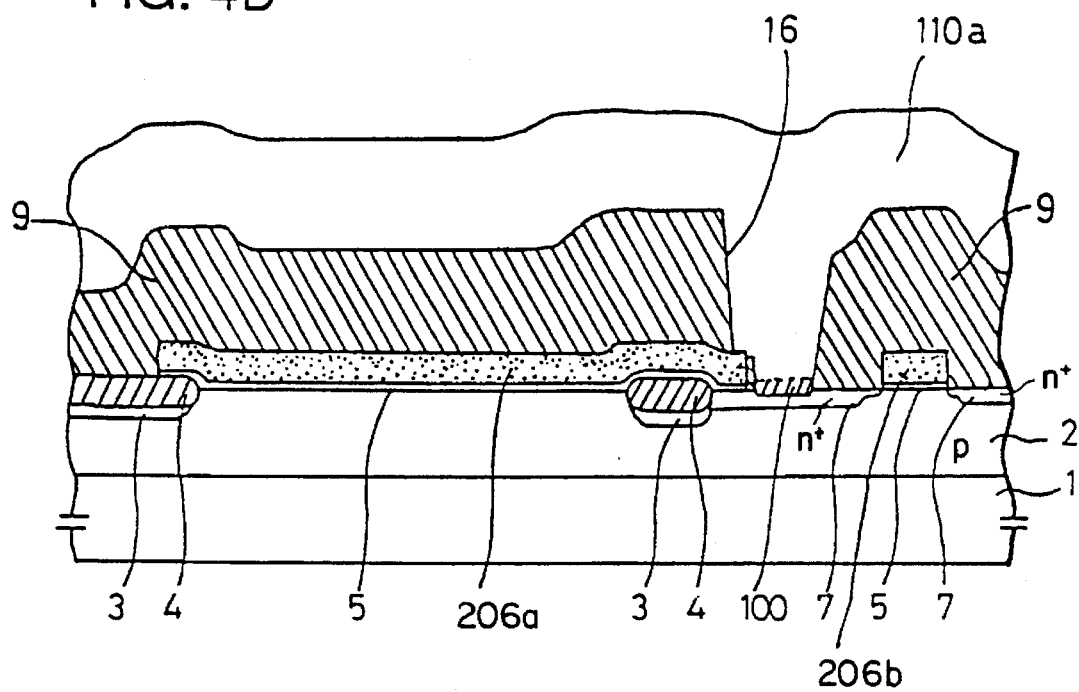

Referring to FIG. 4D, an undoped polycrystalline silicon layer 110a is formed at the surface of interlayer insulating layer 9 and inside opening 16 by, for example, LPCVD. The undoped polycrystalline silicon layer 110a has a thickness that completely fills the interior of opening 16 and that achieved planarization at the upper portion of opening 16. If the opening 16 has a diameter of approximately 600 nm for example, undoped polycrystalline silicon layer 110a is formed of a thickness of not less than 300 nm which is half the diameter thereof. This ensures the interior of opening 16 to be completely filled with polycrystalline silicon layer 110a. However, such a thickness will not result in a completely planarized surface of the polycrystalline silicon layer at the upper portion of opening 16. Therefore, if the diameter of opening 16 is approximately 600 nm, a polycrystalline silicon layer 110a is formed with a preferable thickness of approximately 600 nm. With this thickness, polycrystalline silicon layer 110a is formed with a planarized surface at the upper portion of opening 16.

Figure 4E:
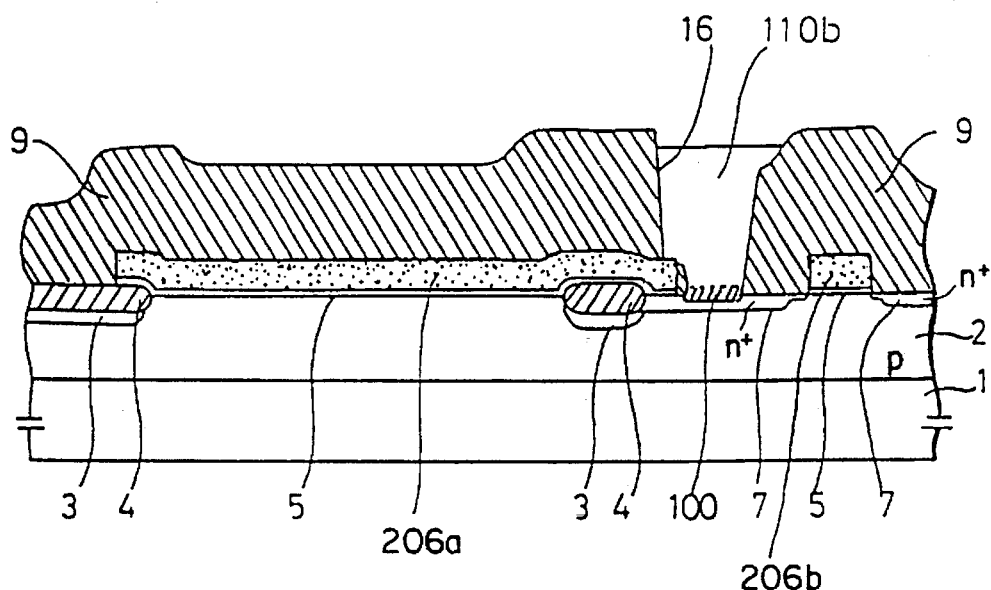

Referring to FIG. 4E, undoped polycrystalline silicon layer 110a is etched by an etchback method, whereby polycrystalline silicon layer 110a remains only inside opening 16. As a result, an undoped silicon plug layer 110b is formed.

Figure 4F:
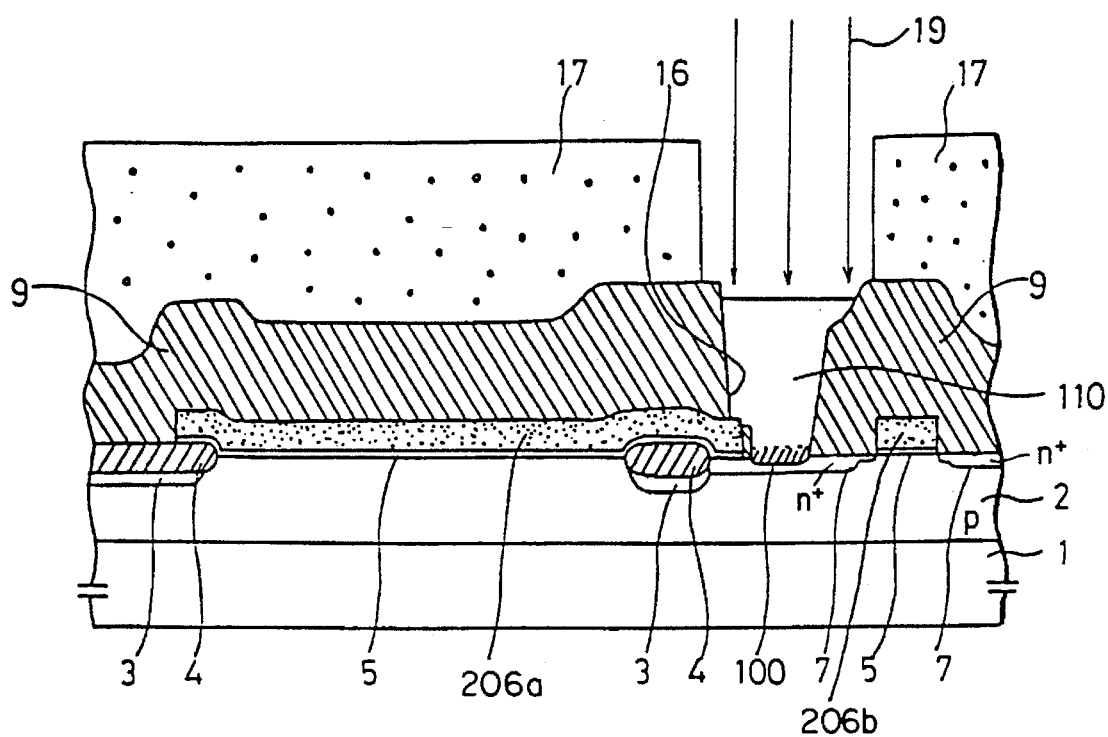

Referring to FIG. 4F, a resist pattern 17 having an opening only above opening 16 is formed on the surface of interlayer insulating layer 9. Using this resist pattern 17 as a mask, p type impurity ions 19 such as boron (B⁺) are implanted into silicon plug layer 110b at, for example, a dosage of 1.5× 10¹⁶/cm² and an implantation energy of 150 keV. Following removal of resist pattern 17, a RTA method, for example, is applied to activate p type impurities 19 implanted into undoped silicon plug layer 110b to form a p type silicon plug layer 110. A RTA method includes the step of applying a heat treatment for 30 seconds at a temperature of 1100° C. in a nitrogen (N₂) ambient in a lamp anneal device with a halogen lamp, for example, as the heat source. Then, the steps described in the first embodiment with reference to FIGS. 2I and 2J are carried out.

A structure of a SRAM memory cell according to a third embodiment of the present invention will be described hereinafter with reference to FIG. 5.

The memory cell of the present embodiment includes the so-called polycide structure of a polycrystalline silicon layer 6a and a refractory metal silicide layer 6b as gate electrode 6 of MOS driver transistor 20a and MOS transfer transistor 22b. Silicon plug layer 15 is formed of polycrystalline silicon of n type conductivity. Because an n type polycrystalline silicon layer is used for interconnection layer 8a in the present embodiment, the conductivity type of silicon plug layer 15 is identical to that of interconnection layer 8a. Therefore, a layer corresponding to refractory metal silicide layer 11 of the first embodiment is not provided at the junction interface thereof. In the present embodiment, a refractory metal silicide layer 113 of titanium silicide, for example, is provided at the junction interface of p⁺ source/drain region 12a of p channel MOS thin film load transistor 21b and interconnection layer 8a. According to the structure of the present embodiment, a refractory metal silicide layer serving as an intermediate conductive layer does not have to be provided between silicon plug layer 15 and interconnection layer 8a. Furthermore, by partially forming a refractory metal silicide layer 113 at the junction portion between p⁺ source/drain region 12a of p channel MOS thin film load transistor 21b and interconnection layer 8a, it can function as an intermediate conductive layer for reducing the occurrence of a voltage drop caused by a pn junction between interconnection layer 8a and p⁺ source/drain region 12a. A method of manufacturing the SRAM memory cell shown in FIG. 5 will be described hereinafter with reference to FIGS. 6A–6D.

The process preceding the step shown in FIG. 6A is similar to the manufacturing steps of the first embodiment described with reference to FIGS. 2A–2F. FIG. 6A shows a structure subsequent to the step of FIG. 2F removing resist pattern 17 and activating the n type impurity.

The only difference in the process preceding the step of forming the structure of the present embodiment shown in FIG. 6A from the above-described first embodiment is that a polycide film (gate electrode 6) of a polycrystalline silicon film 6a and a refractory metal silicide film 6b is formed instead of polycrystalline silicon film 106a having n type impurities introduced as shown in FIG. 2A in the first embodiment. Gate electrode 6 is formed as set forth in the following. Following the formation of oxide film 5, a polycrystalline silicon film 6a is deposited all over the surface of oxide film 5 to a thickness of approximately 100–200 nm by LPCVD. The conductivity of polycrystalline silicon film 6a is of a typical n type in the present embodiment. Conductivity is applied by introducing into a LPCVD chamber at the time of deposition by LPCVD phosphine ($PH_3$) gas including phosphorous together with silane ($SiH_4$) which is the raw material gas.

Then, refractory metal silicide film 6b is deposited by sputtering or CVD. When refractory metal silicide film of a polycide structure is used as a gate electrode for a MOS transistor formed on a substrate such as MOS drive transistor 20a or MOS transfer transistor 22b, tungsten silicide is preferably used having greater resistance to a heat treatment and agents (mainly hydrofluoric acid) than titanium silicide. This is because a gate electrode generally located near the surface of a semiconductor substrate has a greater possibility of being subjected to heat and agents than portions located at an upper layer. Tungsten silicide has a further advantage of being deposited by sputtering or CVD which is not generally used in the method of forming titanium silicide. A refractory metal silicide film 6b of tungsten silicide preferably has a thickness of approximately 100–200 nm.

Referring to FIG. 6A, a polycrystalline silicon film is deposited to a thickness of approximately 100 nm all over the surface thereof by, for example, LPCVD. Then, arsenic is implanted into the polycrystalline silicon film by ion implantation at an implantation energy of 40–60 keV and a dosage of $4\times10^{15}$–$6\times10^{15}/cm^2$, and arsenic implanted into the polycrystalline silicon is activated by heat treatment. Then, the polycrystalline silicon film is patterned to a desired configuration by photolithography and etching to form interconnection layer 8a and gate electrode 8b. Thus, the sectional structure shown in FIG. 6B is achieved.

Then, a gate oxide film 13 is deposited to a film thickness of 20–30 nm by LPCVD all over the surface thereof. Next, an opening is formed in a portion of gate oxide film 13 above opening 16. This formation of an opening includes the step of forming a resist pattern having a hole corresponding to the opening by photolithography, wet-etching with a hydrofluoric acid agent, the gate oxide film 13 exposed at a region of the hole formed by the resist pattern to remove gate oxide film 13, and then further removing the resist pattern. This results in the sectional structure shown in FIG. 6C.

Then, a titanium layer is deposited all over the surface thereof by sputtering. Only the portion of the deposited titanium layer in contact with interconnection layer 8a through the opening of gate oxide film 13 is silicidized by RTA to form a refractory metal silicide layer 113 of titanium silicide. This results in the sectional structure of FIG. 6D.

Figure 5:
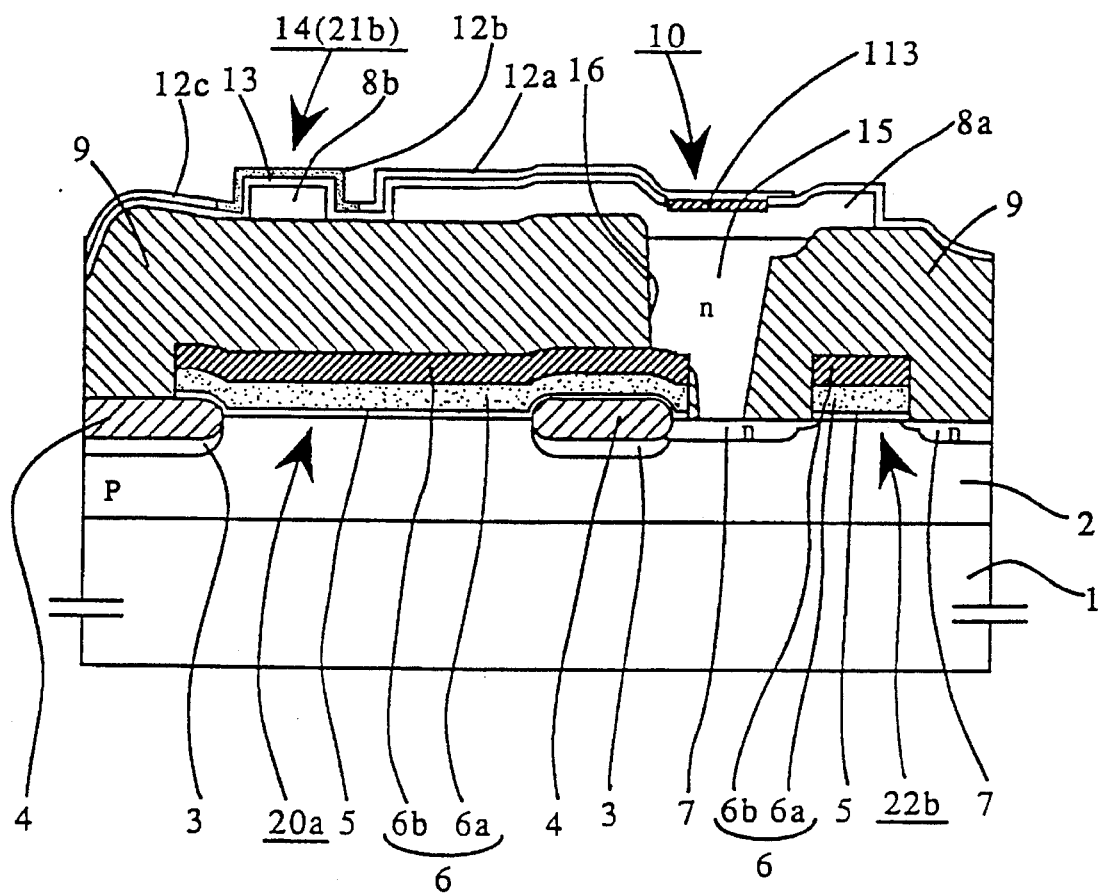
FIG. 5 is a sectional view showing a structure of a SRAM memory cell according to a third embodiment of the present invention.

Next, referring to FIG. 5, a thin polycrystalline silicon layer 12 of approximately 10–40 nm in thickness is deposited without doping impurities all over the surface thereof by, for example, a LPCVD method. Then, a resist pattern is formed corresponding to the channel region of p channel MOS thin film load transistor 14 and $p^+$ source/drain regions of p channel MOS thin film load transistor 14. Using this resist pattern as a mask, an area of polycrystalline silicon layer 12 covered with the resist pattern is etched, followed by removal of the resist pattern. As a result, a thin polycrystalline silicon layer 12 remains which becomes the channel region and the $p^+$ source/drain regions of p channel MOS thin film load transistor 14. Then, a resist pattern is formed over the channel region of p channel MOS thin film load transistor 14. Using this resist pattern as a mask, $BF_2^+$ is ion-implanted at an implantation energy of 10–20 keV and a dosage of $5\times10^{14}$–$5\times10^{15}/cm^2$. Next, the resist pattern used as the mask for ion implantation is removed to form $p^+$ source/drain regions 12a and 12c and channel region 12c of p channel MOS thin film load transistor 14. As a result, the sectional structure of the SRAM memory cell of the present embodiment shown in FIG. 5 is completed.

A structure of a SRAM memory cell according to a fourth embodiment of the present invention will be described hereinafter with reference to FIG. 7.

The structure of the present embodiment is similar to the above-described third embodiment in the structures of gate electrode 6 and silicon plug layer 15. Also, the present embodiment is similar to the third embodiment in that refractory metal silicide layer 11 is not formed at the plane surface of silicon plug layer 15.

The structure of the present embodiment differs from that of the third embodiment in that the gate electrodes of MOS load transistor 21a (not shown in FIG. 7) and 21b have a double layer polycide structure of refractory metal silicide layers 108a and 108b and n type polycrystalline silicon layers 208a and 208b. According to this polycide structure, refractory metal silicide layer 108a serves as an intermediate conductive layer, whereby an ohmic contact is realized between $p^+$ source/drain region 12a of p channel MOS thin film load transistor 21b and interconnection layer 8a at the junction portion therebetween.

A method of manufacturing the SRAM memory cell according to the present embodiment of FIG. 7 will be described with reference to FIGS. 8A and 8B. In the method of manufacturing a SRAM memory cell of the present embodiment, the process until a silicon plug 15 is formed in opening 16 of interlayer insulating layer 9, i.e. the process preceding the step of forming the structure shown in FIG. 6A of the above-described 3rd embodiment is similar to that of the third embodiment.

Following the formation of the structure of FIG. 6A, the manufacturing method of the present fourth embodiment includes the step of depositing to a thickness of 50–100 nm by LPCVD, for example an n type polycrystalline silicon layer 208 of a polycrystalline silicon film having phosphorus doped, and depositing a tungsten silicide layer 108 to a thickness of approximately 50–100 nm by sputtering or CVD, resulting in a polycide film of a double-layered structure. Then, the polycide film is patterned to a predetermined configuration by photolithography and etching to form a interconnection layer 8a of a polycide film including an n type polycrystalline silicon layer 208a and a refractory metal silicide 108a, and a gate electrode 8b of a polycide film including an n type polycrystalline silicon layer 208b and a refractory metal silicide layer 108b. This results in the sectional structure of FIG. 8A.

Then, a gate oxide film 13 of approximately 20–30 nm in thickness is formed by, for example, LPCVD, all over the surfaces of interconnection layer 8a, gate electrode 8b and interlayer insulating layer 9. Next, an opening is formed in a portion of gate oxide film 13 above opening 16 to result in the sectional structure of FIG. 8B.

Figure 7:
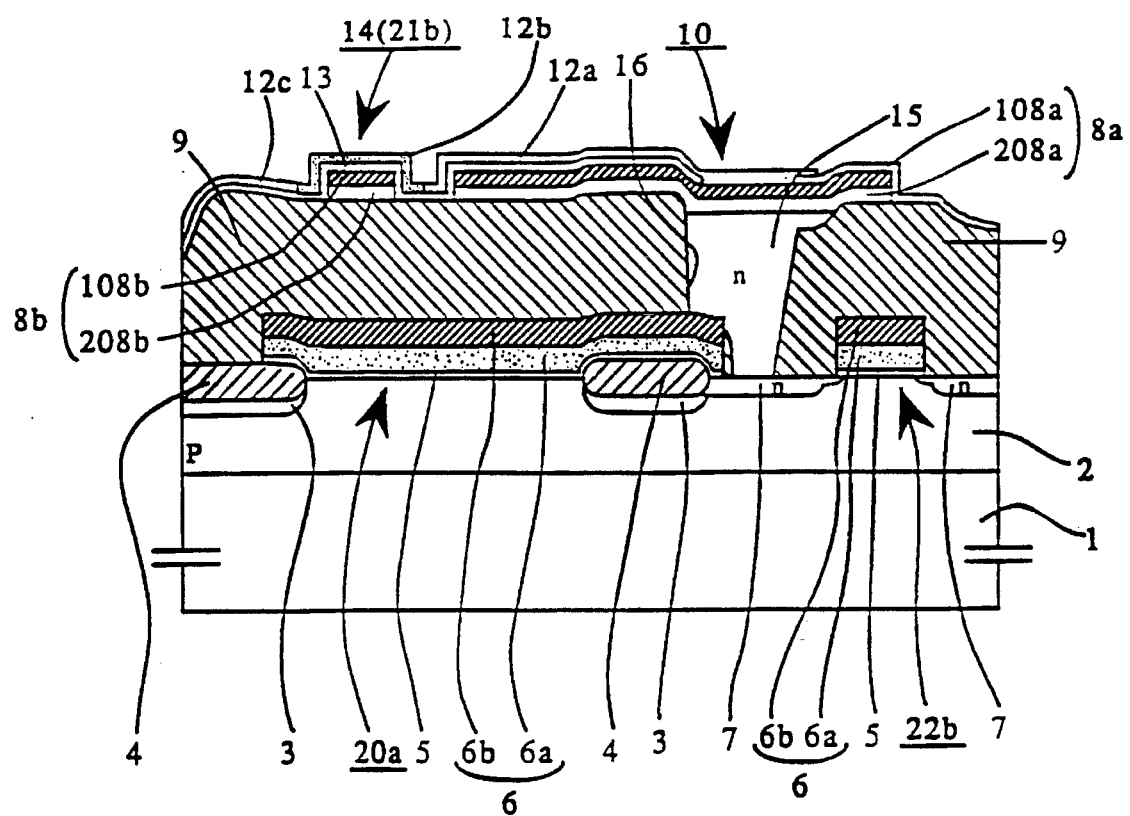
FIG. 7 is a sectional view showing a structure of a SRAM memory cell according to a fourth embodiment of the present invention.

Next, referring to FIG. 7, a thin polycrystalline silicon layer 12 not doped with impurities is deposited to a thickness of approximately 10–40 nm by, for example, LPCVD all over the surface of gate oxide film 13 and the internal surface of the opening formed in gate oxide film 13. Then, a process similar to the manufacturing steps of the third embodiment described with reference to FIG. 5 is carried out, to result in the sectional structure of FIG. 7.

A structure of a SRAM memory cell according to a fifth embodiment of the present invention will be described hereinafter with reference to FIG. 9.

The present embodiment differs from the above-described third and fourth embodiments in that a high concentration $n^{++}$ layer 300 is formed in the proximity of the surface of interconnection layer 8a at the junction of $p^+$ source/drain region 12a of p channel MOS thin film load transistor 21b and interconnection layer 8a. The function of this high concentration $n^{++}$ layer 300 is set forth in the following. Contact between an n type impurity layer of normal concentration and a p type impurity layer of normal concentration causes a pn junction at the contact portion thereof. When current flows across the pn junction, a voltage drop of approximately 0.8 V and approximately 10 V occurs in forward bias and reverse bias, respectively. In the case of a direct contact at the junction of interconnection layer 8a and $p^+$ source/drain region 12a, the aforementioned voltage drop occur to reduce the current feeding ability towards p channel MOS load transistor 14. As a result, a p channel MOS load transistor will not be able to exhibit its inherent performance. In contrast, a $p^{++}$ $n^{++}$ junction is formed in the present embodiment by contact of an n type impurity layer of high concentration such as high concentration $n^{++}$ layer 300 with a p type impurity layer of high concentration such as $p^+$ source/drain region 12a. If the concentration of $n^{++}$ layer 300 and the concentration of $p^+$ source/drain region 12a both are at least $10^{20}/cm^3$, an application of voltage to the pn junction will cause a current flow called tunnel current due to the mechanism of quantum mechanics. This tunnel current will prevent generation of a great voltage drop. Therefore the current feeding ability towards MOS load transistor 14 (21b) can be improved to allow exhibit of the essential performance thereof.

Figure 6C:
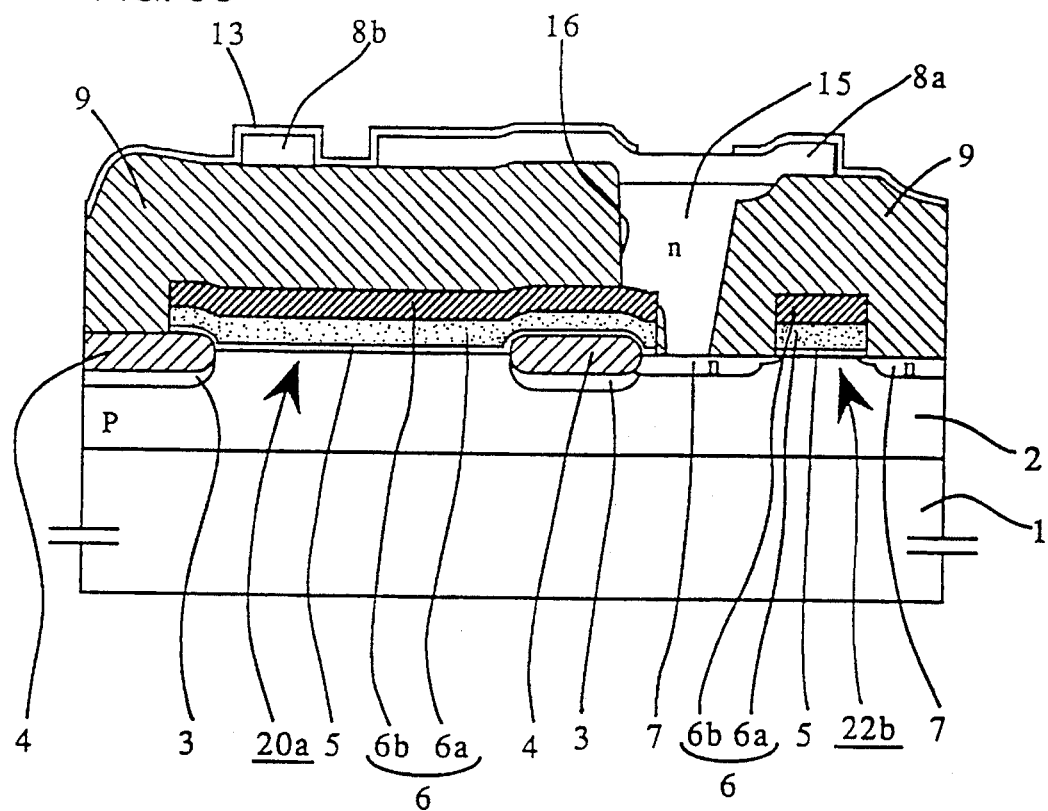

A method of manufacturing the SRAM having the sectional structure of FIG. 9 according to the present embodiment will be described hereinafter. The process preceding the formation of the sectional structure shown in FIG. 6C is substantially similar to the manufacturing step of the above-described third embodiment. The manufacturing step of the present embodiment differs from that of the 3rd embodiment in that the resist pattern 17a (refer to FIG. 10) for forming an opening in gate oxide film 13 is not removed and used as a mask in ion implantation. Ion implantation includes the step of implanting arsenic 18a having a diffusion coefficient lower than phosphorus at an implantation energy of approximately 20 keV and a dosage of approximately $2 \times 10^{15}$–$5 \times 10^{15}/cm^2$ into a region of interconnection layer 8a exposed through the opening in gate oxide film 13, whereby a high concentration $n^{++}$ layer 300 is formed. The implantation energy is set to a relatively low level since implantation is to be carried out at the proximity of the surface of the exposed interconnection layer 8a. More specifically, this is to form a $p^{++}$ $n^{++}$ junction at the connection with $p^+$ source/drain region 12a of p channel MOS thin film load transistor 14 for the flow of a tunnel current. If the implantation energy is relatively high, arsenic will be implanted way below interconnection layer 8a, so that a $p^{++}$ $n^{++}$ junction will not be formed at the junction between $p^{++}$ source/drain region 12a and the exposed interconnection layer 8a. A dosage is selected so that the concentration becomes greater than $10^{20}/cm^3$ in the thin region near the surface of the exposed interconnection layer 8a. The reason why arsenic of a low diffusion coefficient is implanted is to ensure that the impurity concentration in the proximity of the surface of the exposed interconnection layer 8a substantially becomes not more than $10^{20}/cm^3$ due to a great mobility of the impurities induced by heat treatment at a subsequent step (for example, the heat in depositing by LPCV a thin polycrystalline silicon layer 12 which becomes channel region 12b and $p^+$ source/drain regions 12a and 12b of p channel MOS thin film load transistor 14). Then, the resist pattern 17a is removed.

Figure 9:
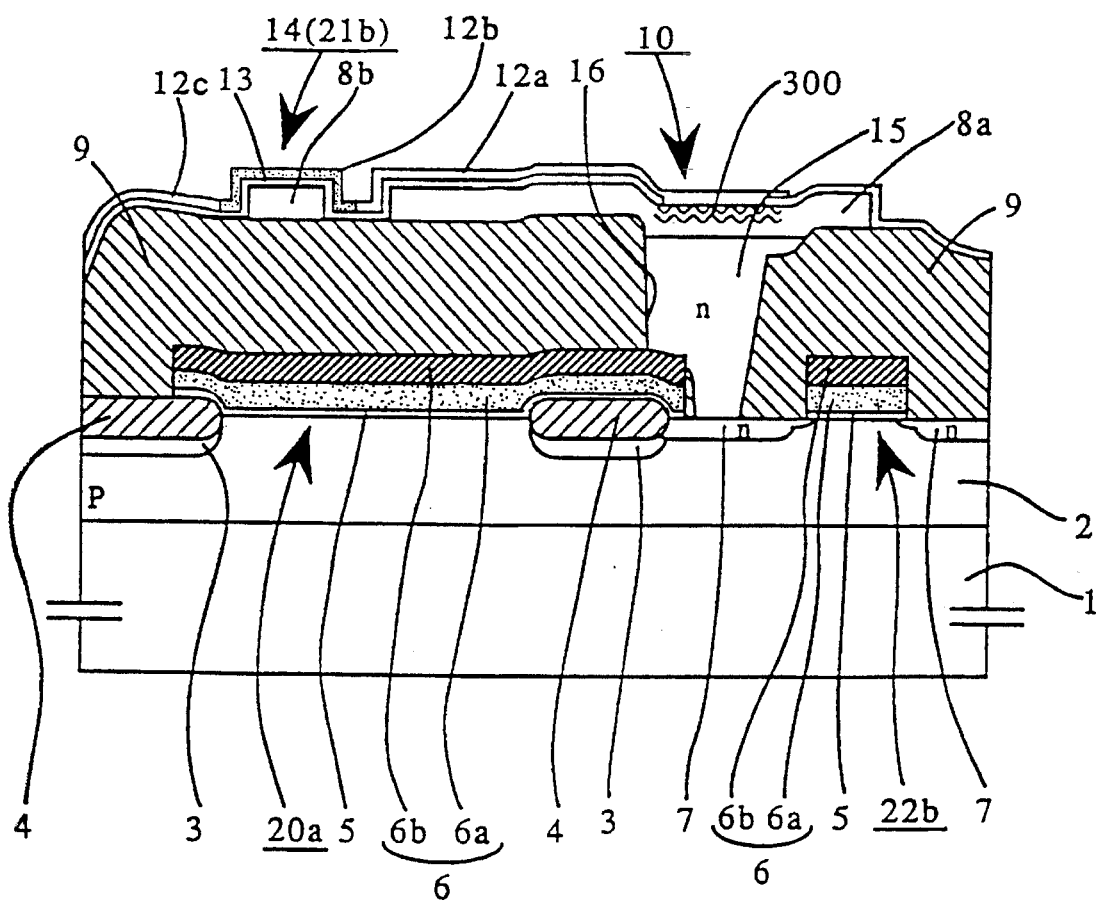
FIG. 9 is a sectional view showing a structure of a SRAM memory cell according to a fifth embodiment of the present invention.

Next, referring to FIG. 9, a thin polycrystalline silicon layer 12 is deposited on the surface of gate oxide film 13 and all over the internal surface of the opening inside gate oxide film 13 by, for example, LPCVD. Then, a process similar to that of the third embodiment described with reference to FIG. 5 is carried out to result in the sectional structure shown in FIG. 9.

Figure 11:
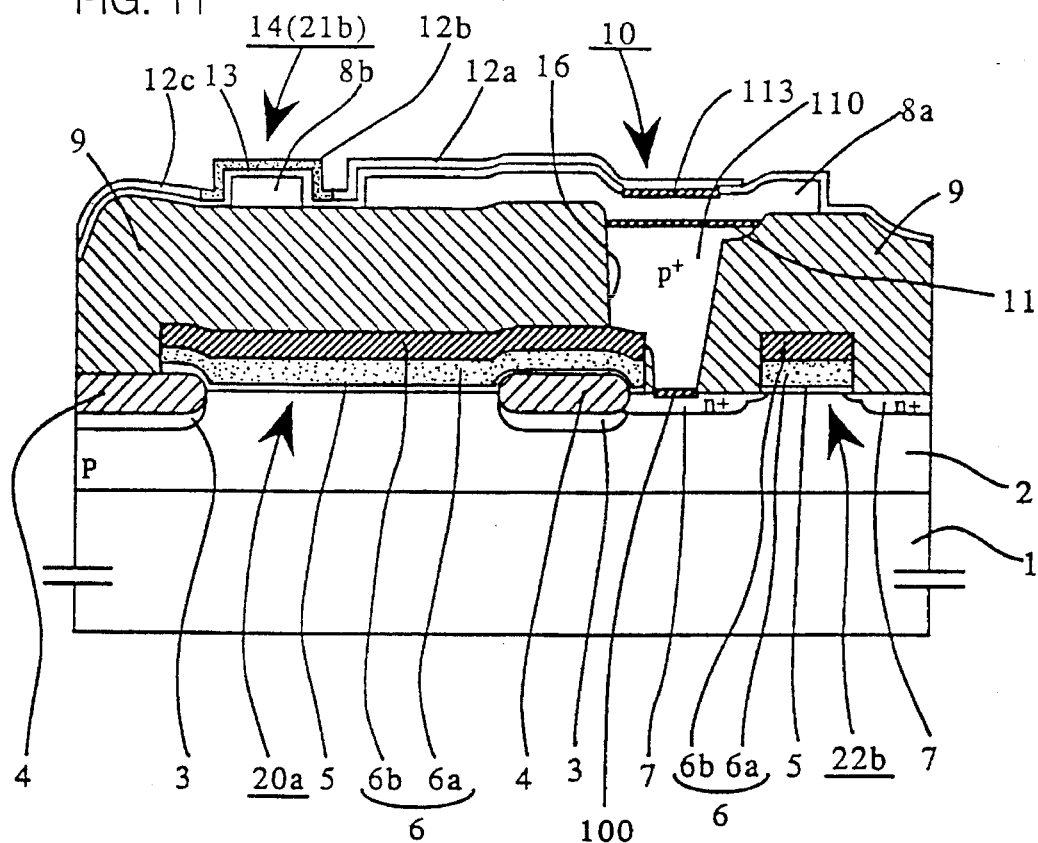
FIG. 11 is a sectional view showing a structure of a SRAM memory cell according to a sixth embodiment of the present invention.

A structure of a SRAM memory cell according to a sixth embodiment of the present invention will be described hereinafter with reference to FIG. 11. The structure of the present embodiment is similar to the structure of the third embodiment in that gate electrode 6 has a polycide structure, and that a refractory metal silicide layer 113 is formed at the junction of interconnection layer 8a having an n type conductivity and $p^+$ source/drain region 12a. The present embodiment differs from the third embodiment in that refractory metal silicide layers 11 and 100 are formed at the junction interface between interconnection layer 8a and silicon plug layer 110 and at the junction interface between $n^+$ source/drain region 7 and silicon plug layer 110 to reduce a voltage drop induced by a pn junction because silicon plug layer 110 is of a p type conductivity having boron or the like introduced. According to the structure of the present embodiment, an intermediate conductive layer is formed at the junction between gate electrode 6 and silicon plug layer 110, the junction between interconnection layer 8a and silicon plug layer 110, the unction between $n^+$ source/drain region 7 and silicon plug layer 110, and the junction between $p^+$ source/drain region 12a and interconnection layer 8a to reduce a voltage drop caused by a pn junction. Thus, a favorable ohmic contact is realized.

A method of manufacturing the SRAM memory cell having the sectional structure of FIG. 11 will be described hereinafter with reference to FIGS. 12A–12E. The manufacturing steps preceding the formation of the sectional structure of FIG. 11 is similar to the manufacturing steps of forming the sectional structure shown in FIG. 4F of the described second embodiment except that gate electrode 6 has a polycide structure similar to that of the third embodiment.

Figure 12A:
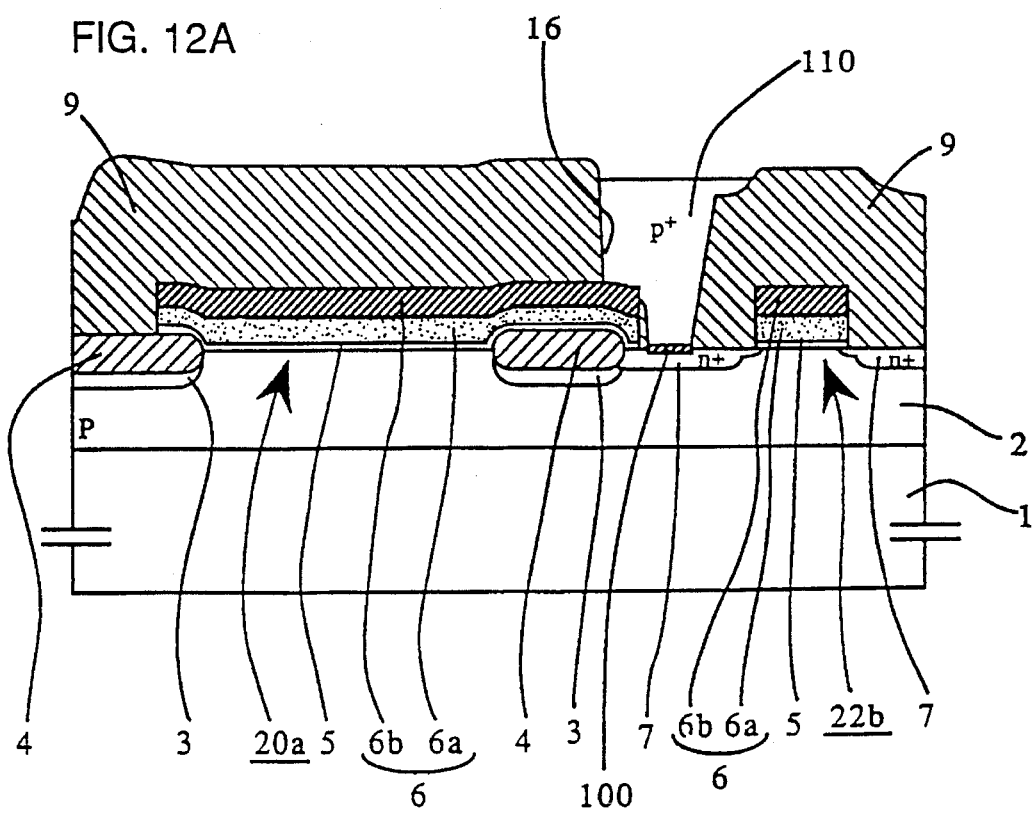
FIGS. 12A–12E are sectional views sequentially showing the manufacturing steps of the memory cell of the structure shown in FIG. 11.

Resist pattern 17 shown in FIG. 4F of the second embodiment is removed, followed by a heat treatment to activate the implanted p type impurities 19. Thus, the sectional structure of FIG. 12A is achieved.

Then, a titanium layer is deposited by sputtering all over the surface of interlayer insulating layer 9 and p type silicon plug layer 110. Then, only the portion of the titanium layer directly in contact with p type silicon plug layer 110 is silicidized by RTA to form refractory metal silicide layer 11 of titanium silicide. Then, the portion of unreactive titanium layer on interlayer insulating layer 9 is removed to result in the sectional structure shown in FIG. 12B.

A polycrystalline silicon film of approximately 100 nm in thickness is deposited by, for example, LPCVD all over the surface of interlayer insulating layer 9 and refractory metal silicide layer 11. Then, steps similar to those of the third embodiments forming the sectional structure of FIG. 6B are carried out to form interconnection layer 8a and gate electrode 8b. This results in the sectional structure shown in FIG. 12C.

Figure 6D:
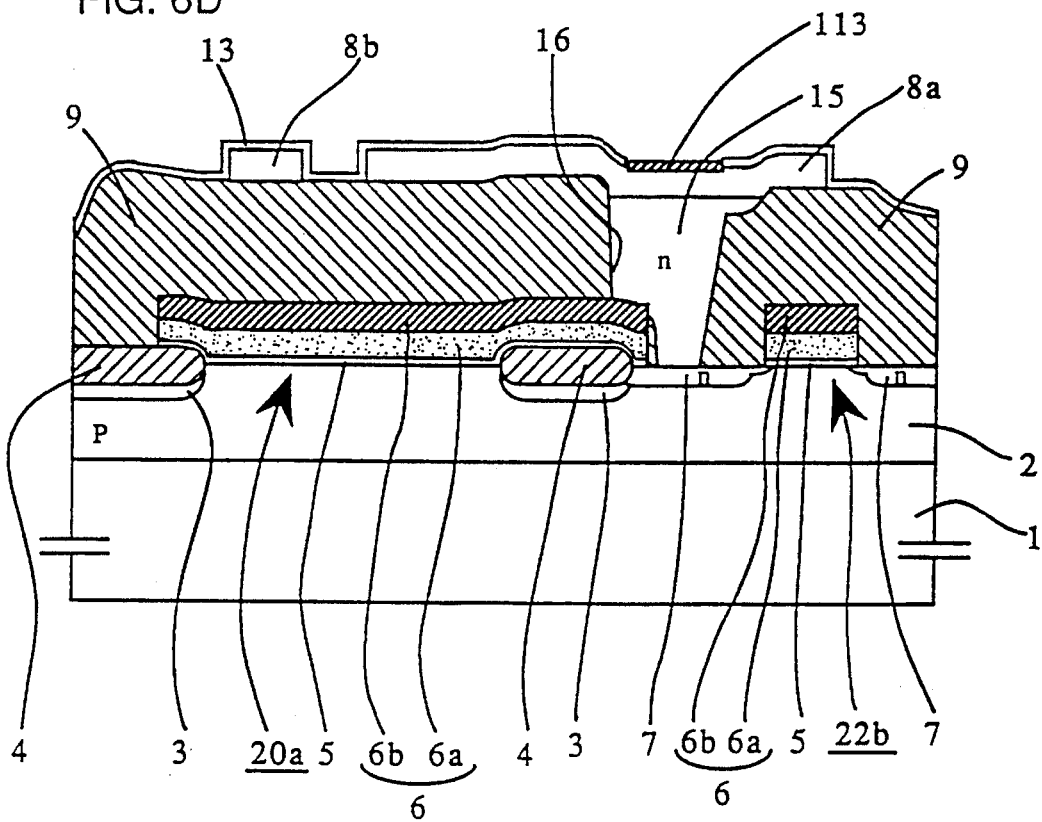
Figure 12B:
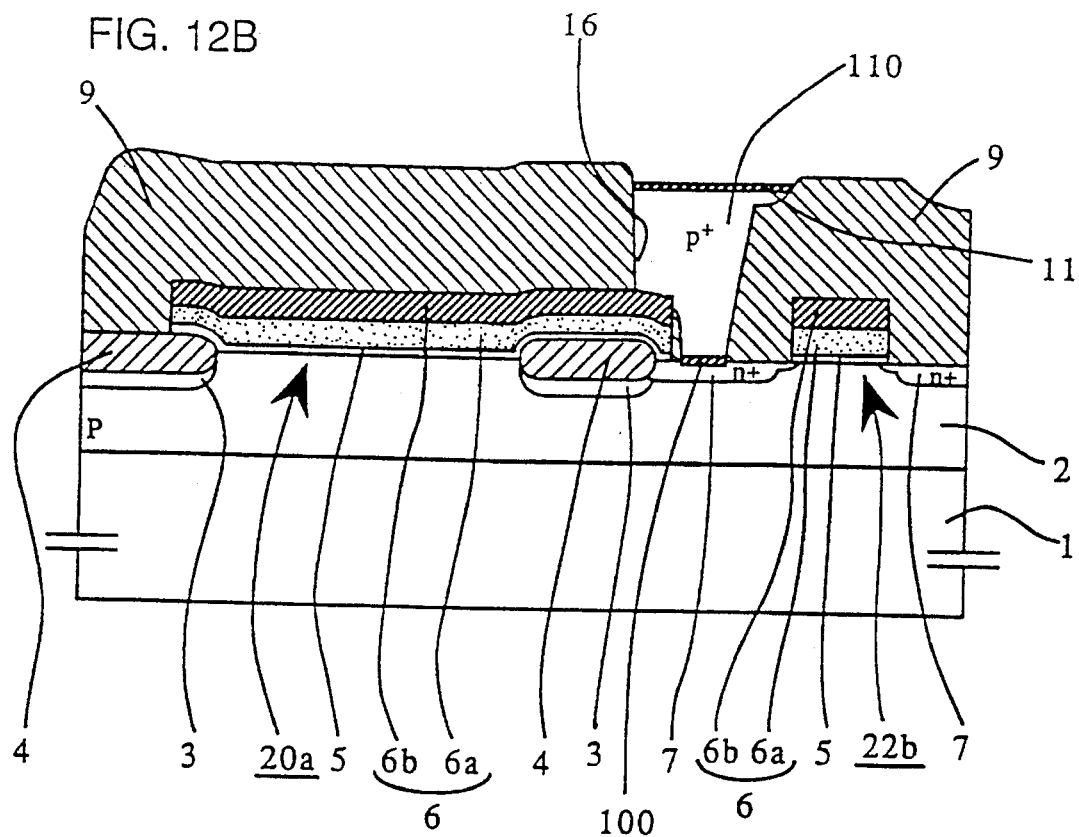
Figure 12C:
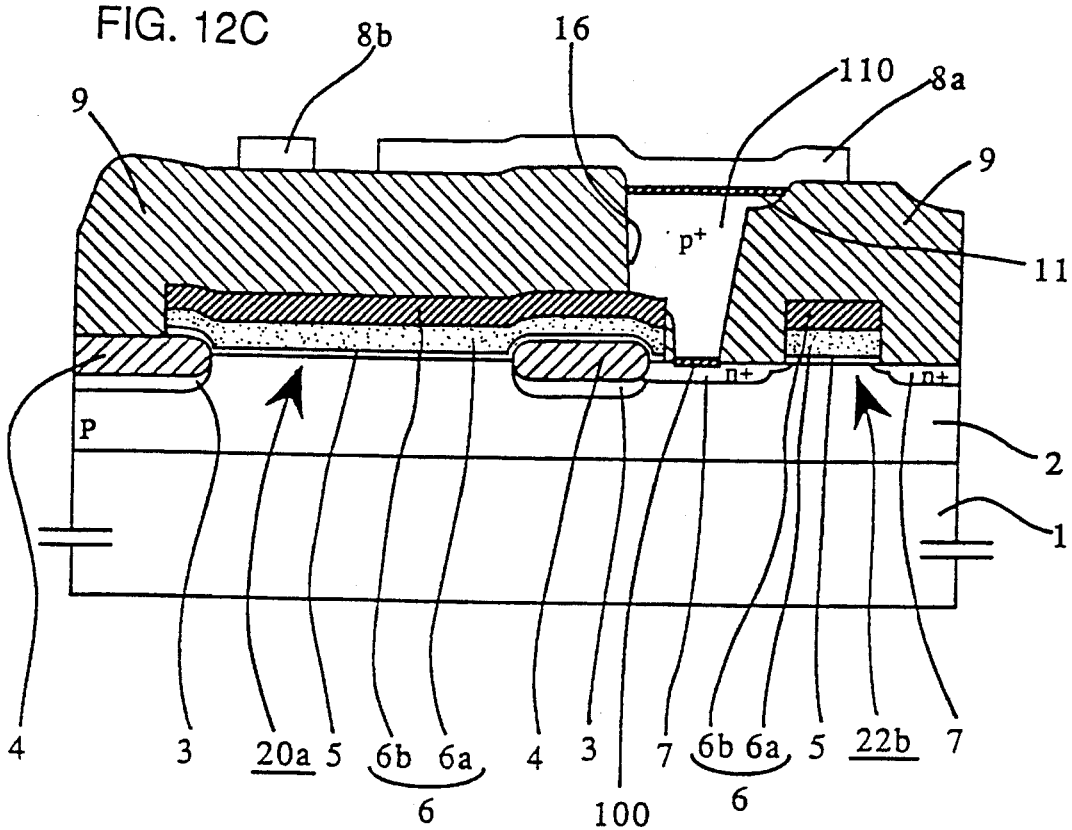
Figure 12D:
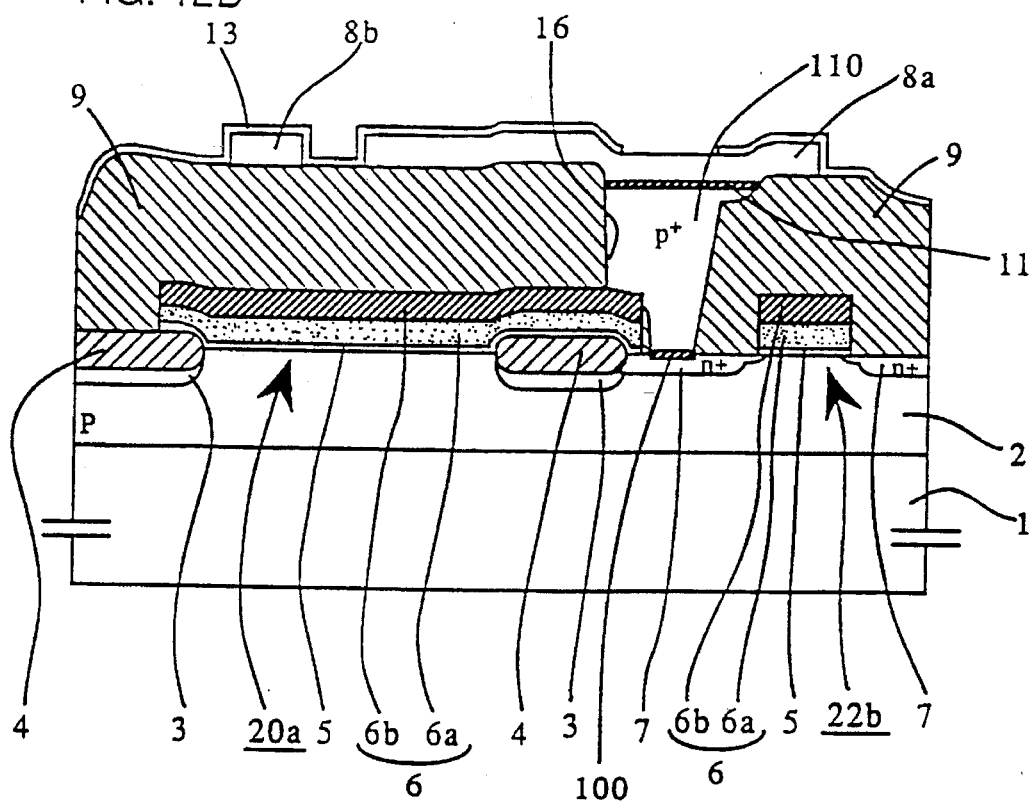
Figure 12E:
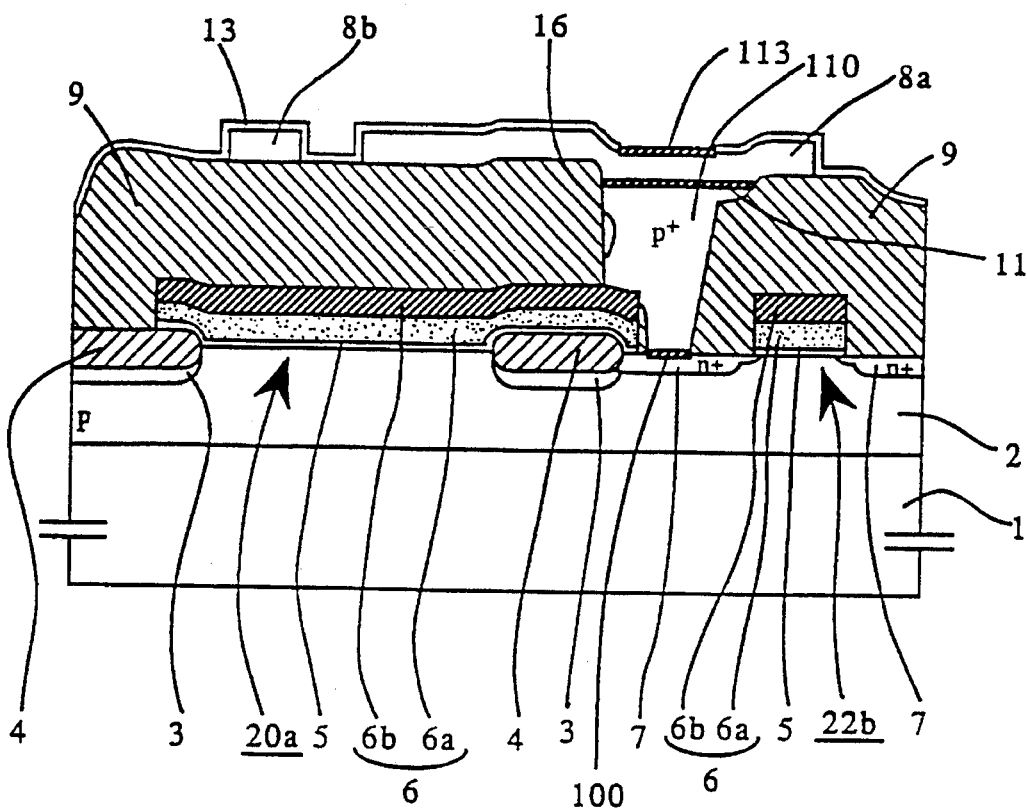

By carrying out steps similar to those of the third embodiment described with reference to FIG. 6C, a sectional structure shown in FIG. 12D is formed. Then, a step similar to that of the third embodiment described with reference to FIG. 6D is carried out to form the sectional structure of FIG. 12E. Next, a step similar to that of the third embodiment described with reference to FIG. 5 is carried out to result in the sectional structure of FIG. 11.

Figure 13:
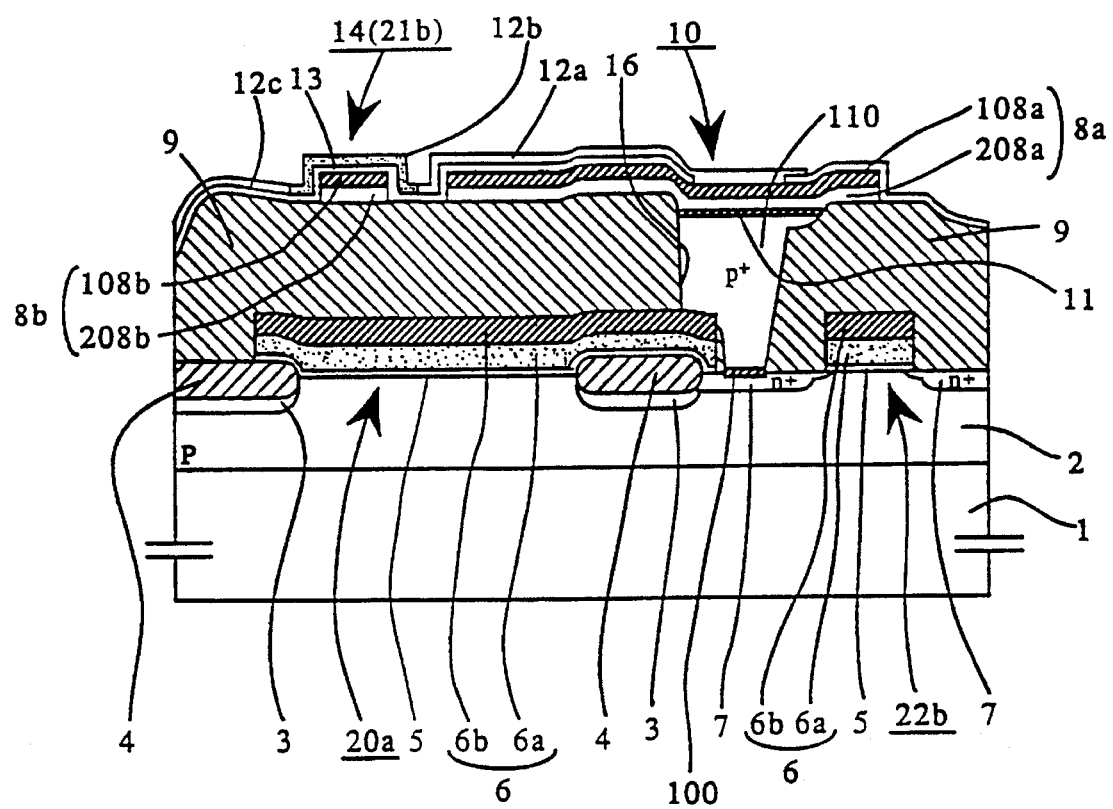
FIG. 13 is a sectional view of a structure of a SRAM memory cell according to a seventh embodiment of the present invention.

A structure of an SRAM memory cell according to a seventh embodiment of the present invention will be described hereinafter with reference to FIG. 13.

The structure of the present embodiment differs from the above-described sixth embodiment only in that, instead of refractory metal silicide layer 113 of FIG. 11, interconnection layer 8a and gate electrode 8b of p channel MOS load transistor 21b have a polycide structure similar to that of the fourth embodiment described with reference to FIG. 7, whereby an ohmic contact is realized at the junction between p$^+$ source/drain region 12a and interconnection layer 8a.

Figure 14A:
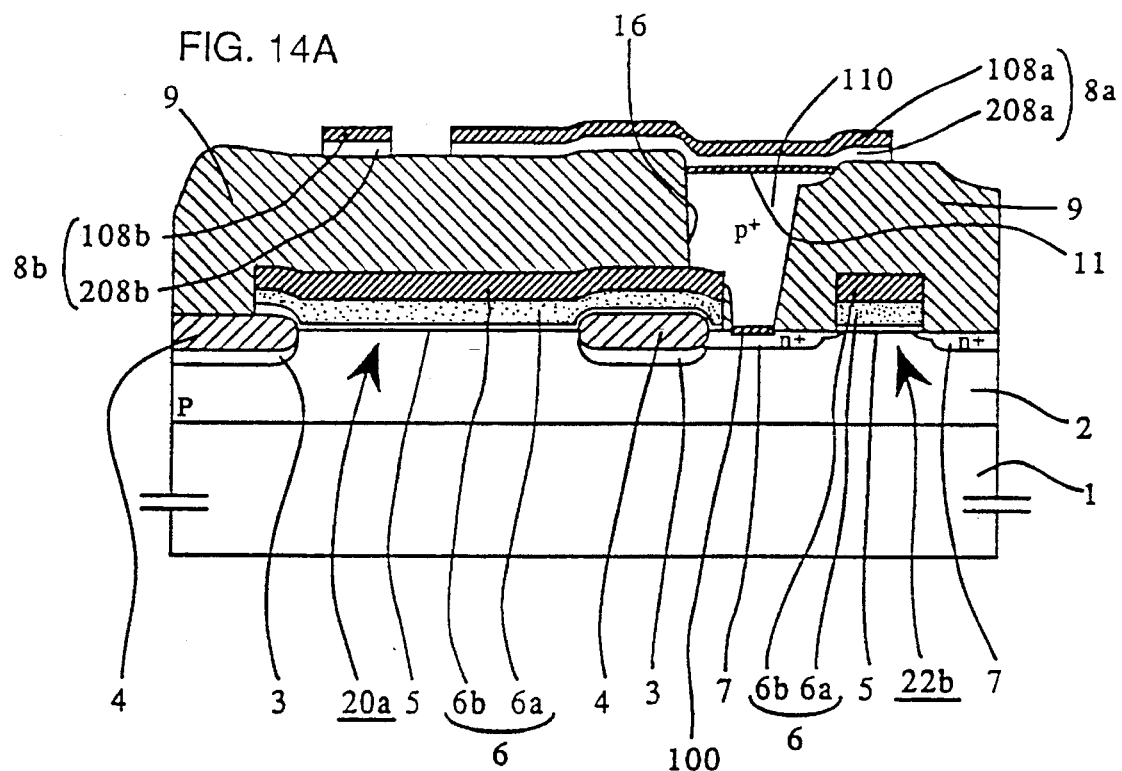
FIGS. 14A–14B are sectional views sequentially showing the steps of manufacturing the memory cell of the structure shown in FIG. 13.
Figure 14B:
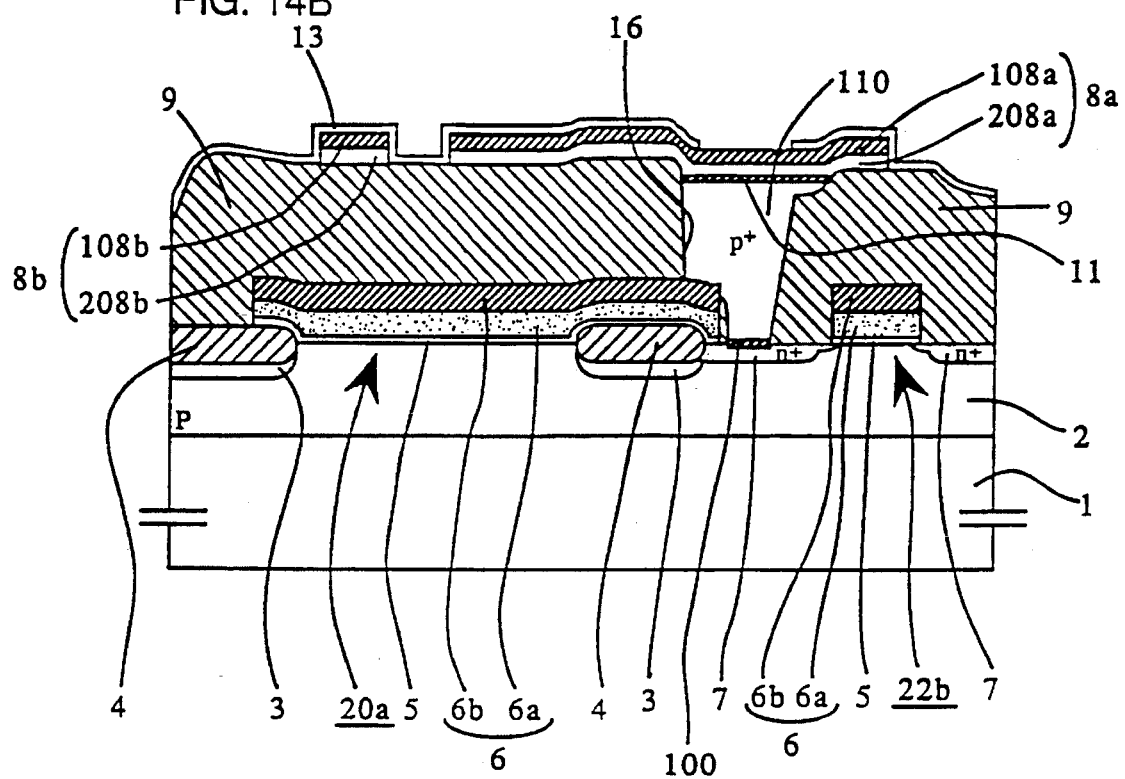

A method of manufacturing the SRAM memory cell shown in FIG. 13 will be described hereinafter with reference to FIGS. 14A and 14B.

In the method of manufacturing the SRAM memory cell of the present embodiment, the process until refractory metal silicide layer 11 is formed on silicon plug layer 110 is similar to that of the sixth embodiment described with reference to FIG. 12B. Following the formation of the structure shown in FIG. 12B, a step similar to that of the fourth embodiment described with reference to FIG. 8A is carried out to form the sectional structure of FIG. 14A.

Next, a step similar to that of the third embodiment described with reference to FIG. 6C is carried out to form the sectional structure shown in FIG. 14B. Then, a step similar to that of the fourth embodiment described with reference to FIG. 7 is carried out to result in the sectional structure shown in FIG. 13.

Figure 15:
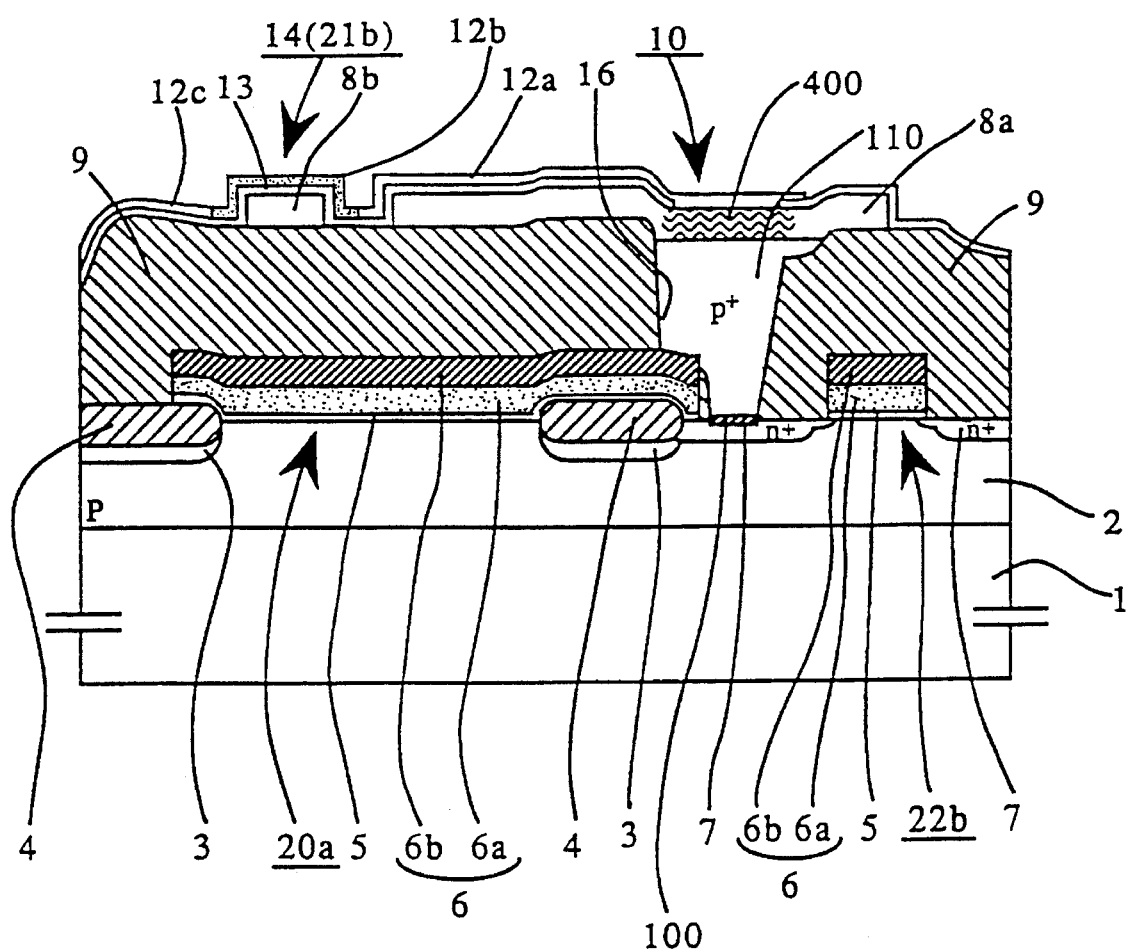
FIG. 15 is a sectional view showing a structure of a SRAM memory cell according to an eighth embodiment of the present invention.

A structure of a SRAM memory cell according to an eighth embodiment of the present invention will be described hereinafter with reference to FIG. 15.

According to the structure of the present embodiment, a gate electrode has a polycide structure, and silicon plug layer 110 is of a p conductivity type. Interconnection layer 8a and gate electrode 8b are of n conductivity type. In order to reduce a voltage drop caused by the pn junction between interconnection layer 8a and silicon plug layer 110 and the pn junction between interconnection layer 8a and p$^+$ source/drain region 12a, a high concentration n$^{++}$ layer 400 having an impurity concentration of not less than $10^{20}$/cm$^3$ is provided as an intermediate conductive layer in interconnection layer 8a in the thickness direction thereof in the proximity of junction portion. High concentration n$^{++}$ layer 400 acts as an intermediate conductive layer at the junction interface between interconnection layer 8a and silicon plug layer 110 and at the junction interface between interconnection layer 8a and p$^{++}$ source/drain region 12a where a pn junction is generated. The specific function of high concentration n$^{++}$ layer 400 as an intermediate conductive layer is similar to that of high concentration n$^{++}$ layer 300 of the fifth embodiment described with reference to FIG. 9.

Figure 16A:
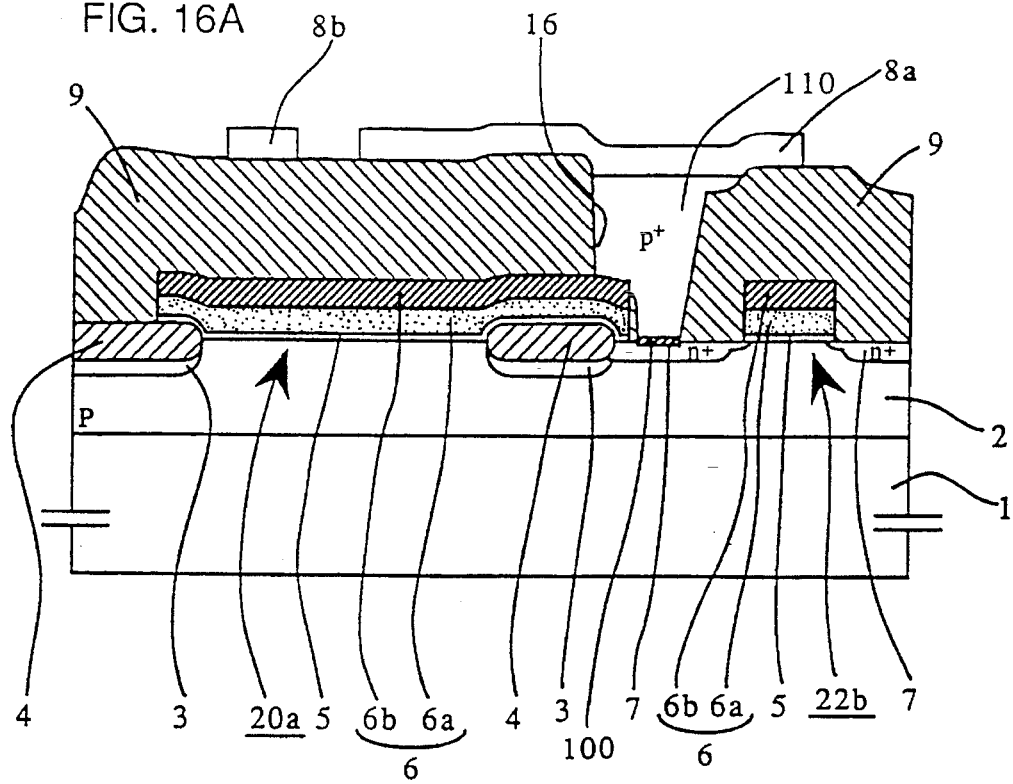
FIGS. 16A and 16B are sectional views sequentially showing the manufacturing steps of the memory cell of the structure shown in FIG. 15.

A method of manufacturing the SRAM memory cell of the present embodiment shown in FIG. 15 will be described hereinafter with reference to FIGS. 16A and 16B. In the method of manufacturing the present embodiment, the process until silicon plug layer 110 is formed is similar to that of the sixth embodiment described with reference to FIG. 12A.

Then, a polycrystalline silicon film is formed all over the surface of interlayer insulating layer 9 and p type silicon plug layer 110, followed by a step similar to that of the third embodiment described with reference to FIG. 6B. Interconnection layer 8a and gate electrode 8b are formed to result in the sectional structure shown in FIG. 16A.

Figure 10:
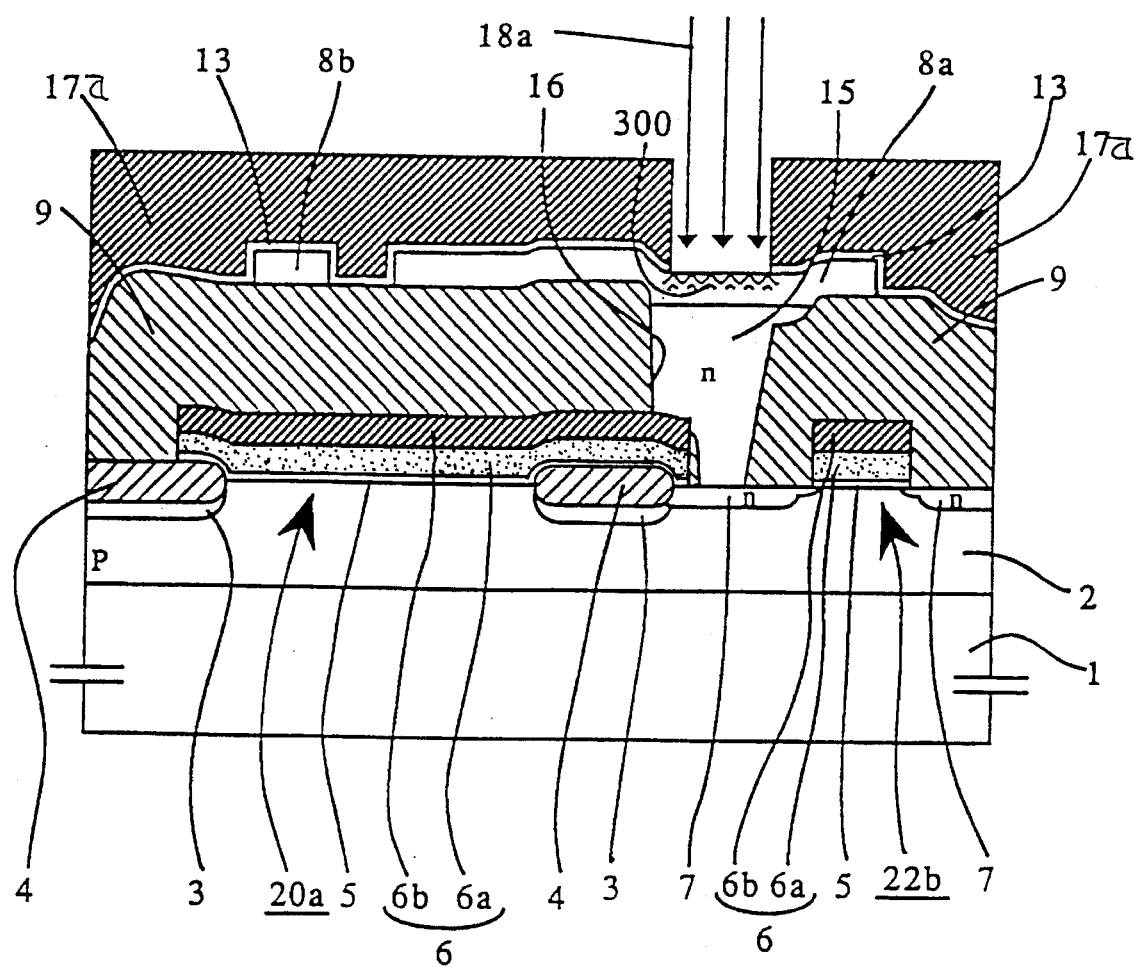
FIG. 10 is a sectional view showing a manufacturing step of the memory cell of the structure shown in FIG. 9.
Figure 16B:
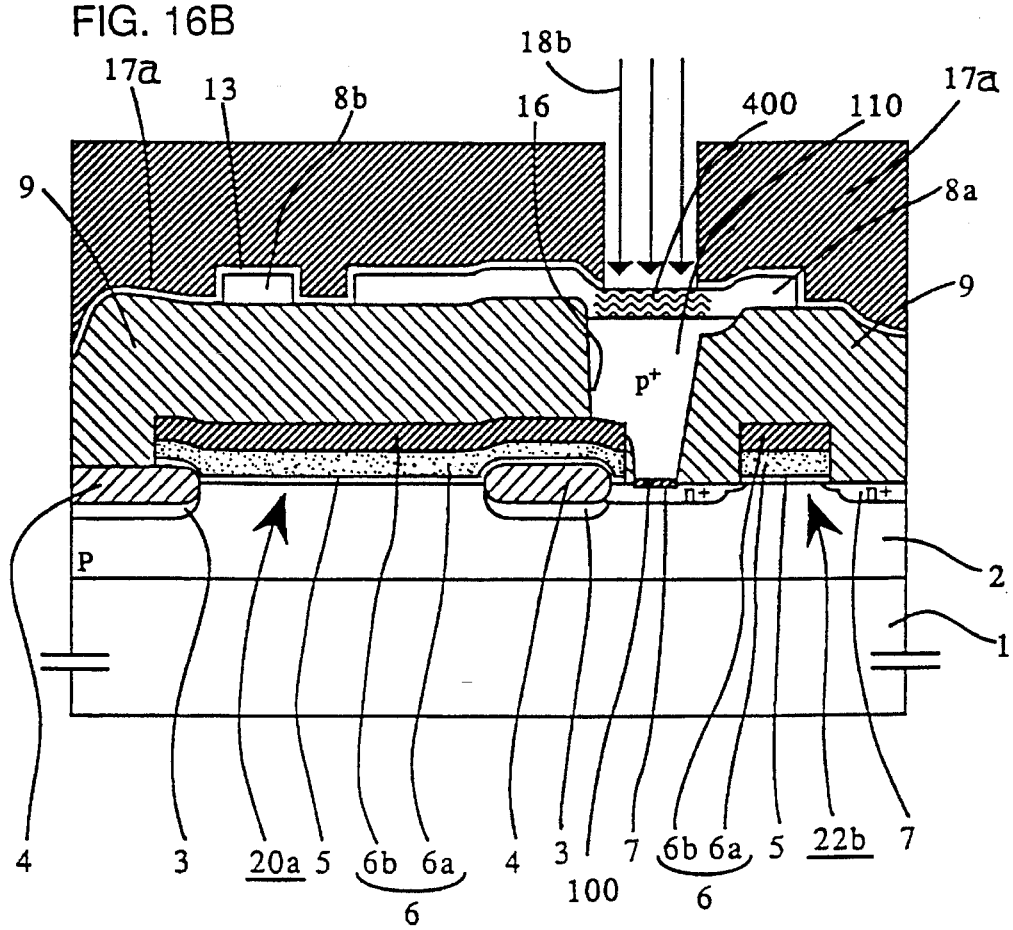

Referring to FIG. 16B, a step similar to that of the fifth embodiment described with reference to FIG. 10 is carried out to form a high concentration n$^{++}$ layer 400. The process of the present embodiment differs from that of the fifth embodiment shown in FIG. 10 only in the points set forth in the following. In the above-described fifth embodiment, ion implantation of arsenic 18a is carried out only once at a high dosage and a relatively low implantation energy. In the present embodiment, arsenic 18b is further implanted at an implantation energy of 130–150 keV and a dosage of $2\times10^{15}$–$5\times10^{15}$/cm$^2$. The second ion implantation in the present embodiment is carried out at an implantation energy higher than that of the first ion implantation to allow a tunnel current flow by implanting arsenic into interconnection layer 8a in the proximity of the junction interface between interconnection layer 8a and p type silicon plug layer 110 to form a high concentration n$^{++}$ layer at the interface for a p$^{++}$ n$^{++}$ junction. The implantation energy for the second implantation of arsenic 18b is selected depending on the film thickness of 100 nm of interconnection layer 8a. High concentration n$^{++}$ layer 400 of the present embodiment can be considered as a double layer of high concentration n$^{++}$ layer 300 of the fifth embodiment described with reference to FIG. 10 and the high concentration n$^{++}$ layer in interconnection layer 8a formed by the second ion implantation of arsenic 18b in the proximity of the junction interface between interconnection layer 8a and p type silicon plug layer 110.

A step similar to that of the fifth embodiment described with reference to FIG. 9 is carried out to result in the sectional structure in FIG. 15.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:

a semiconductor layer, a polycrystalline silicon layer formed on said semiconductor layer with an oxide film therebetween, and having an end portion, an interlayer insulating layer formed to cover a surface of said semiconductor layer and a surface of said polycrystalline silicon layer, a contact hole formed to expose a surface of said semiconductor layer in the proximity of said end portion of said polycrystalline silicon layer and a surface of said end portion of said polycrystalline silicon layer, and a silicon layer embedded in said contact hole so as to directly come into contact with the surface of said end portion of said polycrystalline silicon layer and said surface of said semiconductor layer, said silicon layer having an upper surface which is essentially flat along its entire length, wherein said polycrystalline silicon layer and said silicon layer have the same type of conductivity.

2. The semiconductor device according to claim 1, wherein said polycrystalline silicon layer forms a gate electrode of a first MOS transistor, and said silicon layer is connected to a source or drain region of a second MOS transistor.

3. The semiconductor device according to claim 2, wherein said silicon layer and said source or drain region of a second MOS transistor have the same type of conductivity and directly come into contact with each other at a surface of said semiconductor layer.

4. The semiconductor device according to claim 2, wherein said silicon layer and said source or drain region of a second MOS transistor have different types of conductivity, and have a refractory metal silicide layer interposed at a junction interface therebetween.

5. The semiconductor device according to claim 1, wherein said silicon layer has a plane upper surface, and
   further comprising another polycrystalline silicon layer formed to cover a surface of said interlayer insulating layer and a surface of said silicon layer.

6. The semiconductor device according to claim 5, wherein said silicon layer and said another polycrystalline silicon layer have different types of conductivity, and have an intermediate conductive layer interposed at the interface between said silicon layer and said another polycrystalline silicon layer to reduce a voltage drop at a pn junction.

7. The semiconductor device according to claim 6, wherein said intermediate conductive layer comprises a refractory metal silicide layer.

8. The semiconductor device according to claim 5, wherein said silicon layer and said another polycrystalline silicon layer have the same type of conductivity and are in direct contact with each other.

9. A semiconductor device comprising:

a semiconductor layer, an interlayer insulating layer formed on a surface of said semiconductor layer, a contact hole formed in said interlayer insulating layer to expose a contact portion of a surface of said semiconductor layer, a silicon plug layer embedded inside said contact hole, and having an upper surface which is essentially flat along its entire length, a first polycrystalline silicon layer formed on said interlayer insulating layer, and electrically connected to said silicon plug layer in said contact hole, a second polycrystalline silicon layer formed on a surface of said first polycrystalline silicon layer with an oxide film therebetween, and electrically connected to said first polycrystalline silicon layer by forming an opening in said oxide film in the proximity of a region right above said contact hole, wherein said first polycrystalline silicon layer and said second polycrystalline silicon layer have different types of conductivity, an intermediate conductive layer formed at least in a region between said first polycrystalline silicon layer and said second polycrystalline silicon layer for reducing a voltage drop in a pn junction.

10. The semiconductor device according to claim 9, further comprising a polycrystalline silicon layer formed on said semiconductor layer with an oxide film therebetween, and having one end located in said contact hole to be connected to said silicon plug layer.

11. The semiconductor device according to claim 9, wherein said intermediate conductive layer comprises a refractory metal silicide layer.

12. The semiconductor device according to claim 9, wherein said intermediate conductive layer comprises a high concentration impurity layer formed to a predetermined depth from a surface of said first polycrystalline silicon layer in a region where said first polycrystalline silicon layer and said second polycrystalline silicon layer are connected.

13. The semiconductor device according to claim 12, wherein said silicon plug layer and said first polycrystalline silicon layer have different types of conductivity, and have an intermediate conductive layer further interposed at the junction interface to reduce a voltage drop at a pn junction.

14. The semiconductor device according to claim 12, wherein said silicon plug layer and said first polycrystalline silicon layer have different types of conductivity, and said high concentration impurity layer is formed in a region from an upper surface of said first polycrystalline silicon layer to the junction interface with said silicon plug layer.

15. A semiconductor device comprising:

a semiconductor layer, an interlayer insulating layer formed on a surface of said semiconductor layer, a contact hole formed in said interlayer insulating layer to expose a contact portion of a surface of said semiconductor layer, a silicon plug layer embedded inside said contact hole, and having a plane surface, a first polycrystalline silicon layer formed on said interlayer insulating layer, and electrically connected to said silicon plug layer in said contact hole, a second polycrystalline silicon layer formed on a surface of said first polycrystalline silicon layer with an oxide film therebetween, and electrically connected to said first polycrystalline silicon layer by forming an opening in said oxide film in the proximity of a region right above said contact hole, wherein said first polycrystalline silicon layer and said second polycrystalline silicon layer have different types of conductivity, an intermediate conductive layer formed at least at a junction interface of in a region between said first polycrystalline silicon layer and said second polycrystalline silicon layer for reducing a voltage drop in a pn junction, wherein said intermediate conductive layer comprises a high concentration impurity layer formed to a predetermined depth from a surface of said first polycrystalline silicon layer in a region where said first polycrystalline silicon layer and said second polycrystalline silicon layer are connected, and wherein said silicon plug layer and said first polycrystalline silicon layer have different types of conductivity, and have an intermediate conductive layer further interposed at the junction interface to reduce a voltage drop at a pn junction.

16. A semiconductor device comprising:

a semiconductor layer, an interlayer insulating layer formed on a surface of said semiconductor layer, a contact hole formed in said interlayer insulating layer to expose a contact portion of a surface of said semiconductor layer, a silicon plug layer embedded inside said contact hole, and having a plane surface, a first polycrystalline silicon layer formed on said interlayer insulating layer, and electrically connected to said silicon plug layer in said contact hole, a second polycrystalline silicon layer formed on a surface of said first polycrystalline silicon layer with an oxide film therebetween, and electrically connected to said first polycrystalline silicon layer by forming an opening in said oxide film in the proximity of a region right above said contact hole, wherein said first polycrystalline silicon layer and said second polycrystalline silicon layer have different types of conductivity, an intermediate conductive layer formed at least at a junction interface of in a region between said first polycrystalline silicon layer and said second polycrystalline silicon layer for reducing a voltage drop in a pn junction, wherein said intermediate conductive layer comprises a high concentration impurity layer formed to a predetermined depth from a surface of said first polycrystalline silicon layer in a region where said first polycrystalline silicon layer and said second polycrystalline silicon layer are connected, and wherein said silicon plug layer and said first polycrystalline silicon layer have different types of conductivity, and said high concentration impurity layer is formed in a region from an upper surface of said first polycrystalline silicon layer to the junction interface with said silicon plug layer.

* * * * *